US012730477B2

(12) United States Patent
Yun et al.

(10) Patent No.: US 12,730,477 B2
(45) Date of Patent: Sep. 8, 2026

(54) FLEXIBLE DISPLAY DEVICE WITH IMPROVED MECHANICAL INTEGRITY AND METHOD OF MANUFACTURING THE SAME

(71) Applicant: Samsung Display Co., Ltd., Yongin-si (KR)

(72) Inventors: Dae Sang Yun, Cheongju-si (KR); Young Ji Kim, Hwaseong-si (KR); Wan Jung Kim, Hwaseong-si (KR); Hyo Young Mun, Hwaseong-si (KR); Yi Seul Um, Hongseong-gun (KR); So Young Lee, Suwon-si (KR); Young Hoon Lee, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 720 days.

(21) Appl. No.: 17/528,820

(22) Filed: Nov. 17, 2021

(65) Prior Publication Data

US 2022/0190264 A1 Jun. 16, 2022

(30) Foreign Application Priority Data

Dec. 10, 2020 (KR) ........................ 10-2020-0171933

(51) Int. Cl.
*G06F 1/16* (2006.01)
*H10K 59/12* (2023.01)
*H10K 59/80* (2023.01)
*H10K 77/10* (2023.01)

(52) U.S. Cl.
CPC .......... *G06F 1/1652* (2013.01); *H10K 77/111* (2023.02); *H10K 59/12* (2023.02); *H10K 59/8791* (2023.02)

(58) Field of Classification Search
CPC ...... H10K 50/80; H10K 71/00; H10K 71/231; H10K 59/12
See application file for complete search history.

(56) References Cited

U.S. PATENT DOCUMENTS

| | | | |
|---|---|---|---|
| 10,295,853 | B2 | 5/2019 | Tang |
| 10,401,560 | B2 | 9/2019 | Kawata |
| 10,930,715 | B2 | 2/2021 | Cho et al. |

(Continued)

FOREIGN PATENT DOCUMENTS

| | | | |
|---|---|---|---|
| CN | 106773207 | A | 5/2017 |
| CN | 109585457 | A | 4/2019 |

(Continued)

OTHER PUBLICATIONS

Kim; Chang Nam, KR-20120082729-A, Machine Translation (Year: 2012).*

(Continued)

*Primary Examiner* — Jacob Y Choi
*Assistant Examiner* — Grace Cha
(74) *Attorney, Agent, or Firm* — Womble Bond Dickinson (US) LLP

(57) ABSTRACT

A display device includes: a flexible substrate; and a plurality of supports on the flexible substrate and spaced apart from each other in a first direction and extending in a second direction crossing the first direction, wherein each of the plurality of supports includes glass and has a thickness of 0.1 mm or more.

20 Claims, 24 Drawing Sheets

(56) References Cited

U.S. PATENT DOCUMENTS

| | | | | |
|---|---|---|---|---|
| 11,903,238 | B2 | 2/2024 | Park et al. | |
| 12,016,240 | B2 | 6/2024 | Lee et al. | |
| 2017/0092884 | A1* | 3/2017 | Zhang | H10K 59/879 |
| 2017/0263887 | A1* | 9/2017 | Han | H10K 59/131 |
| 2018/0067522 | A1 | 3/2018 | Namkung et al. | |
| 2018/0175310 | A1* | 6/2018 | Lee | B32B 27/308 |
| 2019/0341566 | A1 | 11/2019 | Lee et al. | |
| 2020/0176699 | A1 | 6/2020 | Lee et al. | |
| 2022/0103670 | A1 | 3/2022 | Liao | |
| 2024/0155865 | A1 | 5/2024 | Park et al. | |
| 2024/0306484 | A1 | 9/2024 | Lee et al. | |

FOREIGN PATENT DOCUMENTS

| | | | | | |
|---|---|---|---|---|---|
| CN | 111180485 | A | | 5/2020 | |
| DE | 20-2020-100190 | | | 5/2020 | |
| IN | 201814036742 | A | | 4/2019 | |
| JP | 2016-124746 | A | | 7/2016 | |
| KR | 20120082729 | A | * | 7/2012 | H10K 77/111 |
| KR | 10-2017-0124120 | A | | 11/2017 | |
| KR | 10-2018-0042515 | A | | 4/2018 | |
| KR | 10-2018-0135704 | A | | 12/2018 | |
| KR | 10-2019-0135173 | A | | 12/2019 | |
| KR | 10-2020-0013924 | A | | 2/2020 | |

OTHER PUBLICATIONS

European Search Report for EP 21213721.0 dated Oct. 7, 2022, 14 pages.

Chinese Office Action corresponding to CN Application No. 202111503805.4, dated Jun. 26, 2026 (9 pages).

* cited by examiner

FIG. 20

FLEXIBLE DISPLAY DEVICE WITH IMPROVED MECHANICAL INTEGRITY AND METHOD OF MANUFACTURING THE SAME

CROSS-REFERENCE TO RELATED APPLICATION

The present application claims priority to and the benefit of Korean Patent Application No. 10-2020-0171933 filed on Dec. 10, 2020 in the Korean Intellectual Property Office, the entire content of which is incorporated herein by reference.

BACKGROUND

1. Field

Aspects of some embodiments of the present disclosure relate to a display device and a method of manufacturing the same.

2. Description of the Related Art

The importance and use of display devices is increasing with the development of multimedia. In response to this, various types of display devices such as liquid crystal display (LCD) devices and organic light-emitting display (OLED) devices have been used.

Recently, display devices, to which flexible display panels capable of bending, folding, or rolling are applied to provide a large screen and improve portability during use, are being developed. In order to maintain display quality and mechanical integrity, it may be desirable for components of the flexible display panel, for example, a substrate, to have relatively excellent surface quality while securing flexibility and mechanical strength enabling bending, folding, rolling, or the like.

The above information disclosed in this Background section is only for enhancement of understanding of the background and therefore the information discussed in this Background section does not necessarily constitute prior art.

SUMMARY

Aspects of some embodiments of the present disclosure may include a display device having relatively excellent surface quality while securing flexibility and mechanical strength enabling bending, folding, rolling, or the like.

Aspects of some embodiments of the present disclosure may also include a method of manufacturing the display device.

It should be noted that characteristics of embodiments according to the present disclosure are not limited to the above-described characteristics, and other characteristics of embodiments according to the present disclosure will be more apparent to those skilled in the art from the following descriptions.

According to some embodiments of the present disclosure, a display device includes a flexible substrate; and a plurality of supports arranged on the flexible substrate to be spaced apart from each other in a first direction and extending in a second direction crossing the first direction, wherein each of the plurality of supports includes glass and has a thickness of 0.1 mm or more.

According to some embodiments of the present disclosure, a display device includes a flexible substrate; and a support on the flexible substrate and made of a rigid material, wherein the support includes a plurality of grooves arranged to be spaced apart from each other in a first direction and extending in a second direction crossing the first direction.

According to some embodiments of the present disclosure a display device includes a first substrate; a thin-film transistor layer on the first substrate; a light-emitting element layer on the thin-film transistor layer; and a second substrate on the light-emitting element layer, wherein at least one of the first substrate or the second substrate includes a flexible substrate and at least one support member that is on the flexible substrate and made of glass.

According to some embodiments of the present disclosure, a method of manufacturing a display device includes preparing a rigid substrate and a flexible substrate on the rigid substrate; irradiating a laser to the rigid substrate in a predetermined pattern; and etching the rigid substrate.

Other details and characteristics of some example embodiments for solving the above problems are included in the detailed description and the drawings.

BRIEF DESCRIPTION OF THE DRAWINGS

The above and other aspects and features of embodiments according to the present disclosure will become more apparent by describing aspects of some example embodiments thereof in more detail with reference to the attached drawings, in which:

FIG. 20 is a flowchart illustrating a method of manufacturing a display device according to some embodiments.

DETAILED DESCRIPTION

Aspects of some embodiments of the present invention will now be described more fully hereinafter with reference to the accompanying drawings, in which some example embodiments of the invention are shown. This invention may, however, be embodied in different forms and should not be construed as limited to the embodiments set forth herein. Rather, these embodiments are provided so that this disclosure will be more thorough and more complete, and will more fully convey the scope of embodiments according to the present invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, aspects of some example embodiments will be described in more detail with reference to the accompanying drawings.

Figure 1:
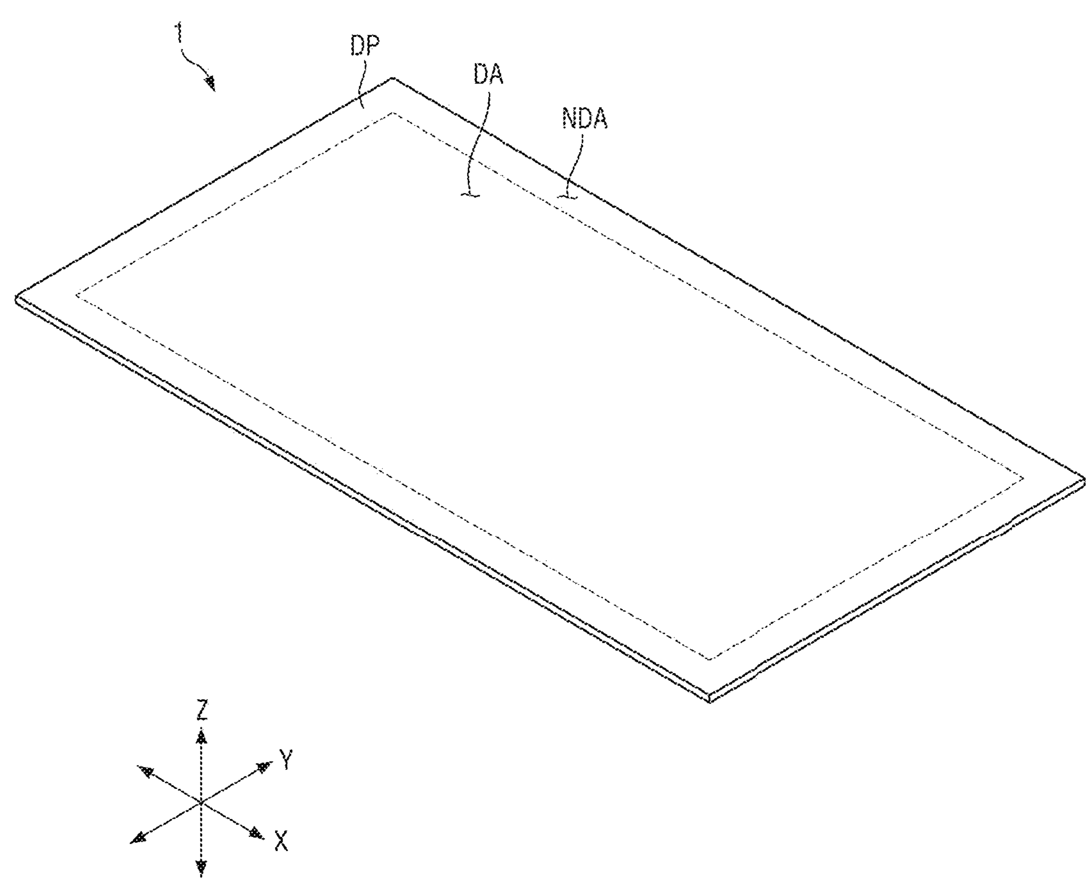
FIG. 1 is a perspective view of a display device according to some embodiments.
Figure 2:
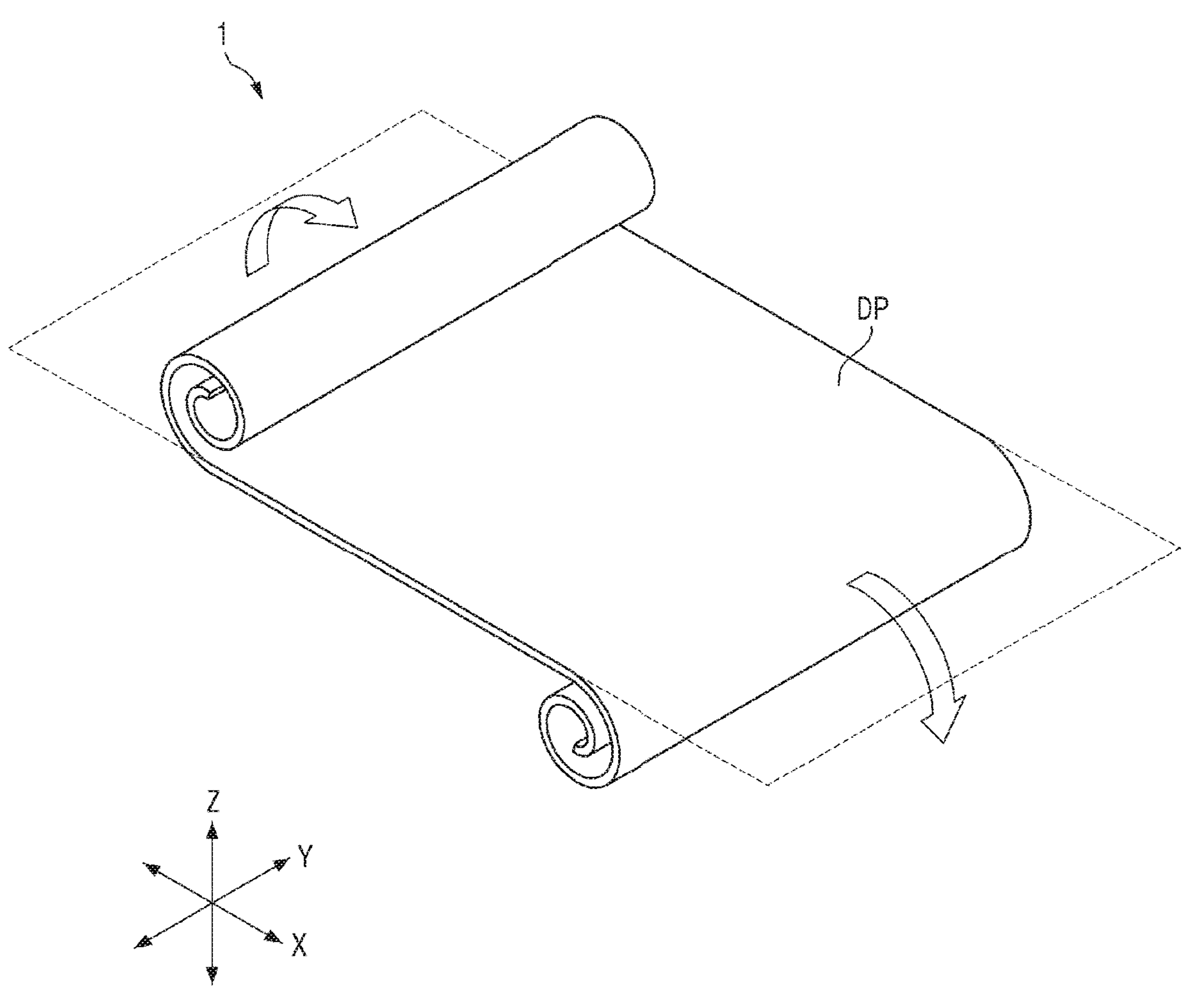
FIG. 2 is a perspective view of the display device in a rolled state according to some embodiments.
Figure 3:
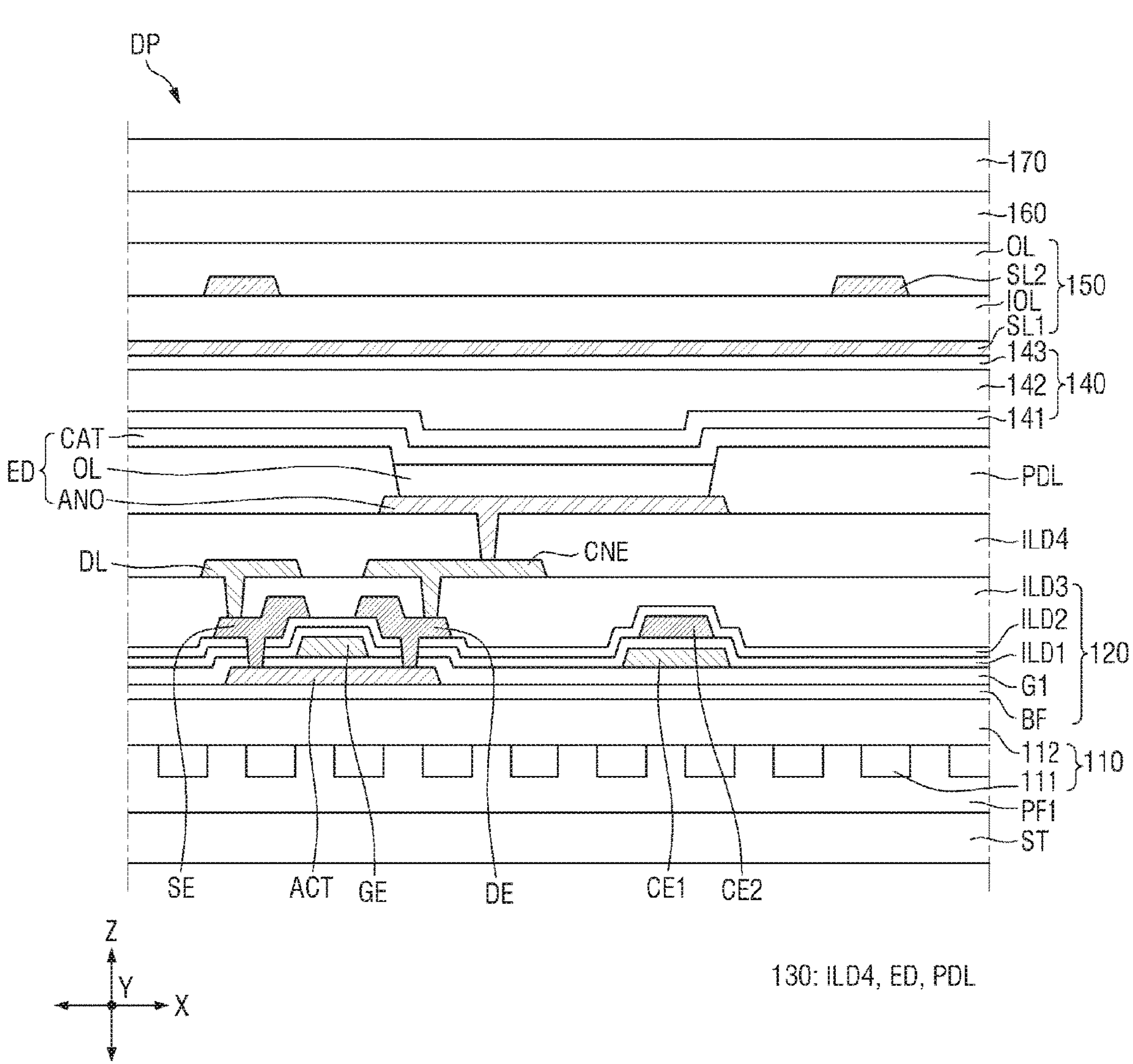
FIG. 3 is a cross-sectional view of a display panel according to some embodiments.
Figure 4:
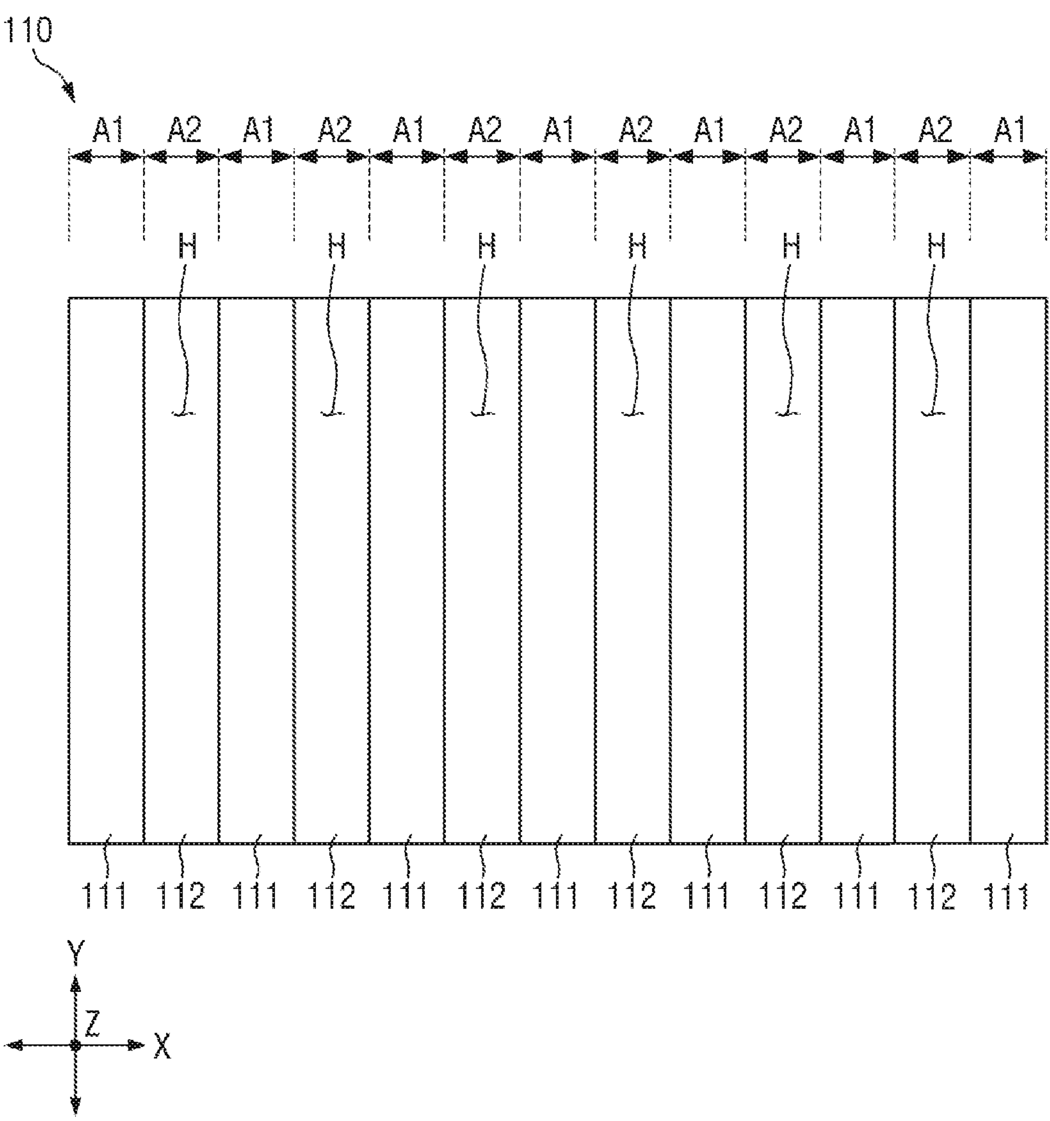
FIG. 4 is a plan view illustrating a rear surface of a first substrate of FIG. 3
Figure 5:
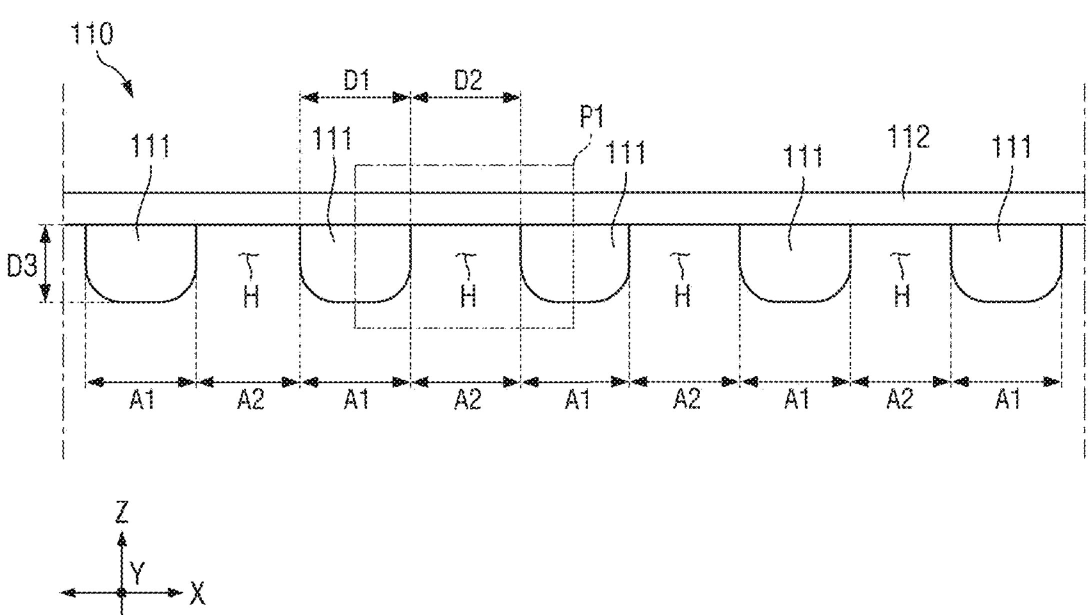
FIG. 5 is a cross-sectional view of the first substrate of FIG. 3.
Figure 6:
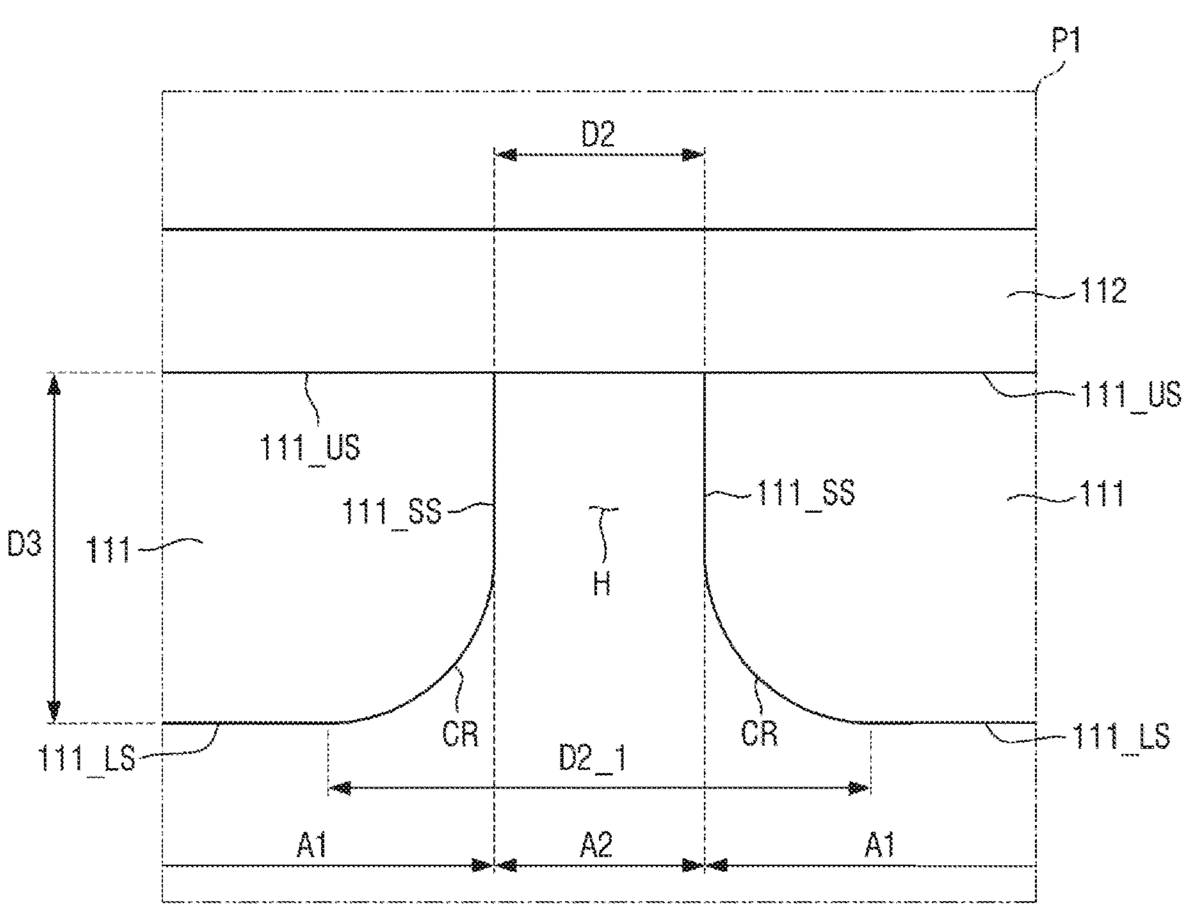
FIG. 6 is an enlarged cross-sectional view of portion "P1" of FIG. 5.

FIG. 1 is a perspective view of a display device according to some embodiments. FIG. 2 is a perspective view of the display device in a rolled state according to some embodiments. FIG. 3 is a cross-sectional view of a display panel according to some embodiments. FIG. 4 is a plan view illustrating a rear surface of a first substrate of FIG. 3. FIG. 5 is a cross-sectional view of the first substrate of FIG. 3. FIG. 6 is an enlarged cross-sectional view of portion "P1" of FIG. 5.

Hereinafter, a first direction X, a second direction Y, and a third direction Z cross each other in different directions. For example, the first direction X may be a length direction, the second direction Y may be a width direction, and the third direction Z may be a thickness direction. When the display device is viewed from the Z direction, this may be referred to a plan view. The first direction X, the second direction Y, and the third direction Z may each include two or more directions. For example, based on the perspective view of FIG. 1, the third direction Z may include an upward direction toward an upper side of the drawing, and a downward direction toward a lower side of the drawing. The plan view may refer to a direction which faces the display surface of the display device. In this case, one surface of a member arranged to face in the upward direction may be referred to as an upper surface, and the other surface of the member arranged to face in the downward direction may be referred to as a lower surface. However, the above directions should be understood as referring to relative directions, and embodiments according to the present disclosure are not limited thereto.

Referring to FIG. 1, a display device 1 may include one of various devices configured to display videos or images. Examples of the display device 1 may include smart phones, mobile phones, tablet personal computers (PCs), personal digital assistants (PDAs), portable multimedia players (PMPs), televisions, game machines, wrist watch-type electronic devices, head-mounted displays, PC monitors, laptop computers, vehicle navigation devices, vehicle dashboards, digital cameras, camcorders, outdoor advertising boards, electronic notice boards, various medical devices, various inspection devices, various home appliances such as refrigerators and washing machines, Internet of Things (IoT) devices, and the like, but embodiments according to the present disclosure are not limited thereto.

The display device 1 may be a flexible display device. As used herein, the term "flexible" may refer to being all bendable, foldable that is foldable and unfoldable, rollable that is rollable and unfoldable, and the like. For example, the flexible display device 1 may include a bendable display device 1, a foldable display device 1, a rollable display device 1, and the like. The bendable display device 1 may refer to the display device 1 in which a display panel DP, which will be described in more detail below, is maintained in a bent state after the display device 1 is manufactured regardless of an operation state. Unlike the bendable display device 1, the foldable display device 1 may refer to the display device 1 in which the display panel DP is foldable or unfoldable after the display device 1 is manufactured. Like the foldable display device 1, the rollable display device 1 may refer to the display device 1 in which the display panel DP is rollable or unfoldable after the display device 1 is manufactured.

The display device 1 includes the display panel DP that displays images.

The display panel DP is a panel on which a video or an image may be displayed. Examples of the display panel DP may include self-luminous display panels such as an organic light-emitting display (OLED) panel, an inorganic electroluminescence (EL) display panel, a quantum dot light-emitting display (QED) panel, a micro light-emitting display (micro LED) panel, a nano LED panel, a plasma display panel (PDP), a field emission display (FED) panel, and a cathode ray tube (CRT) display panel as well as light-receiving display panels such as a liquid crystal display (LCD) panel and an electrophoretic display (EPD) panel, but embodiments according to the present disclosure are not limited thereto, and the display panel DP may include any suitable display according to the design of the display device 1. Hereinafter, the OLED panel will be described as an example of the display panel DP, and unless particular distinction is required, the OLED panel applied to the embodiments will be simply referred to as the display panel DP. However, the embodiments are not limited to the OLED panel, and other display panels, including those listed above or any other suitable display panel, may be applied within the scope of sharing technical ideas.

The display panel DP may have a rectangular shape in a plan view. For example, a planar shape of the display panel DP may be a rectangular shape formed by long sides extending in the first direction X and short sides extending in the second direction Y.

The display panel DP may include a display area DA in which an image or a video is displayed and a non-display area NDA in which an image or a video is not displayed.

A plurality of pixels may be arranged in the display area. The display area DA may be located at an upper surface of the display panel DP, but embodiments according to the present disclosure are not limited thereto. The display area DA may also be located on a lower surface and/or side surfaces of the display panel DP.

The non-display area NDA may be arranged around the display area DA. The non-display area NDA may be arranged at an edge of the display panel DP. The non-display area NDA may be arranged to surround at least a portion of the display area DA. An element, a circuit, a line, a pad, and the like for driving the pixel may be arranged in the non-display area NDA. According to some embodiments, the non-display area NDA may be arranged in a band shape surrounding the display area DA, but embodiments according to the present disclosure are not limited thereto.

Referring to FIGS. 1 and 2, the display panel DP may be flexible and thus may be bent. For example, as shown in a left side of FIG. 2, at least a portion of the display panel DP may be bent in the upward direction and rolled. For example, as shown in a right side of FIG. 2, at least a portion of the display panel DP may be bent in the downward direction and rolled. The display panel DP may be bent in both the upward and downward directions, or may be bent only in one direction of the upward and downward directions. In FIG. 2, the display panel DP rolled in the first direction X as an example, but the direction in which the display panel DP is rolled is not limited thereto. For example, according to some embodiments, the display panel DP may also be rolled in the second direction Y.

Hereinafter, "one surface" or "a first surface" may be a surface arranged to face a direction in which a video or an image is displayed, and "the other surface" or "a second surface" may be an opposite surface of the one surface. "One surface" may refer to the upper surface, and "the other surface" may refer to the lower surface, but embodiments according to the present disclosure are not limited thereto.

With further reference to FIG. 3, the display panel DP may include a first substrate 110, a circuit driving layer 120, a light-emitting element layer 130, a thin-film encapsulation layer 140, a touch sensing layer 150, a polarizing layer 160, and a protective layer 170. The circuit driving layer 120, the light-emitting element layer 130, the thin-film encapsulation layer 140, the touch sensing layer 150, the polarizing layer 160, and the protective layer 170 may be sequentially stacked on one surface of the first substrate 110.

The first substrate 110 may include a first flexible substrate 112 and a plurality of first supports 111.

The first flexible substrate 112 may be made of an insulating material such as a polymer resin having flexibility. Examples of the polymer material may include polyethersulfone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. According to some embodiments, the first flexible substrate 112 may include polyimide (PI), but embodiments according to the present disclosure are not limited thereto.

The first flexible substrate 112 may have a relatively small thickness suitable for bending or rolling of a display module. When the first flexible substrate 112 has a small thickness, flatness of the display panel DP may be reduced. However, as the plurality of first supports 111 are arranged on the other surface of the first flexible substrate 112 to be described later, the flatness of the display panel DP may be improved.

The plurality of first supports 111 may be arranged on the other surface of the first flexible substrate 112. A detailed configuration of the plurality of first supports 111 will be described below with further reference to FIG. 4.

The circuit driving layer 120 is arranged on one surface of the first substrate 110. The circuit driving layer 120 includes a circuit for driving the light-emitting element layer 130. The circuit may include thin-film transistors. The thin-film transistor may be implemented by a semiconductor layer ACT, a gate electrode GE, a source electrode SE, and a drain electrode DE, which will be described below.

For example, the circuit driving layer 120 may include a buffer layer BF, the semiconductor layer ACT, a gate insulating layer G1, the gate electrode GE, a first capacitor electrode CE1, a first insulating layer ILD1, a second capacitor electrode CE2, a second insulating layer ILD2, the source electrode SE, the drain electrode DE, a third insulating layer ILD3, a data line DL, a connection electrode CNE, and a fourth insulating layer ILD4.

The buffer layer BF may be arranged on the first flexible substrate 112. The buffer layer BF may be formed of a plurality of stacked films. The buffer layer BF may serve to protect the thin-film transistors and a light-emitting element ED from moisture and impurities (F and C—H) that penetrate through the first flexible substrate 112.

The buffer layer BF may be formed of at least one inorganic film among a silicon oxide film, a silicon nitride film, a silicon oxynitride layer, a titanium oxide film, and an aluminum oxide film.

The buffer layer BF may be a single film made of a material selected from among the above example materials or may be a multi-layer film made of materials selected from among the above example materials.

The semiconductor layer ACT of the thin-film transistor may be arranged on the buffer layer BF. The semiconductor layer ACT may include an oxide semiconductor or polycrystalline silicon.

The gate insulating layer G1 may be arranged on the semiconductor layer ACT. The gate insulating layer G1 may include an inorganic material. For example, the gate insulating layer G1 may be formed of at least one inorganic film among a silicon oxide film, a silicon nitride film, a silicon oxynitride layer, a titanium oxide film, and an aluminum oxide film. The gate insulating layer G1 is illustrated in FIG. 3 as being arranged over the whole surface of the first flexible substrate 112, but embodiments are not limited thereto, and the gate insulating layer G1 may be arranged only in an overlapping area between the semiconductor layer ACT and the gate electrode GE to be described in more detail below.

The gate electrode GE of the thin-film transistor and the first capacitor electrode CE1 of a capacitor may be arranged on the gate insulating layer G1.

The gate electrode GE may be formed as a single layer or a multi-layer made of one selected from among molybdenum (Mo), aluminum (Al), chromium (Cr), gold (Au), titanium (Ti), nickel (Ni), neodymium (Nd), and copper (Cu) or an alloy thereof.

The first capacitor electrode CE1 may include at least one among the above example materials of the gate electrode GE. The first capacitor electrode CE1 and the gate electrode GE may include the same material and may be formed through the same process.

The first insulating layer ILD1 may be arranged on the gate electrode GE. The first insulating layer ILD1 may include an organic insulating material or an inorganic insulating material.

The second capacitor electrode CE2 of the capacitor may be arranged on the first insulating layer ILD1. The second capacitor electrode CE2 may be arranged to overlap the first capacitor electrode CE1 in the thickness direction. The second capacitor electrode CE2 may form the capacitor together with the first capacitor electrode CE1 using the first insulating layer ILD1 as a dielectric.

The second insulating layer ILD2 may be arranged on the second capacitor electrode CE2. The second insulating layer ILD2 may include an organic insulating material or an inorganic insulating material.

The source electrode SE and the drain electrode DE may be arranged on the second insulating layer ILD2. The source electrode SE may be electrically connected to a source area of the semiconductor layer ACT through a contact hole passing through the gate insulating layer G1 and the insulating layers ILD1 and ILD2, and the drain electrode DE may be electrically connected to a drain area of the semiconductor layer ACT through a contact hole passing through the gate insulating layer G1 and the insulating layers ILD1 and ILD2. Each of the source electrode SE and the drain electrode DE may be formed as a single layer or a multi-layer made of one selected from among molybdenum (Mo), aluminum (Al), chromium (Cr), gold (Au), titanium (Ti), nickel (Ni), neodymium (Nd), and copper (Cu), and an alloy thereof.

The third insulating layer ILD3 may be arranged on the source electrode SE and the drain electrode DE. The third insulating layer ILD3 may include an organic insulating material or an inorganic insulating material. The third insulating layer ILD3 may be a protective film protecting the source electrode SE and the drain electrode DE.

The data line DL and the connection electrode CNE may be arranged on the third insulating layer ILD3. The data line DL may be electrically connected to the source electrode SE through a contact hole passing through the third insulating layer ILD3, and the connection electrode CNE may be electrically connected to the drain electrode DE through a contact hole passing through the third insulating layer ILD3.

Each of the data line DL and the connection electrode CNE may be formed as a single layer or a multi-layer made of one selected from among molybdenum (Mo), aluminum (Al), chromium (Cr), gold (Au), titanium (Ti), nickel (Ni), neodymium (Nd), and copper (Cu), and an alloy thereof.

The fourth insulating layer ILD4 may be arranged on the data line DL and the connection electrode CNE. The fourth insulating layer ILD4 may include an organic insulating material or an inorganic insulating material. The fourth insulating layer ILD4 may be a protective film protecting the data line DL and the connection electrode CNE. In some cases, the fourth insulating layer ILD4 may be a planarization film.

The fourth insulating layer ILD4 may include an acryl resin, an epoxy resin, a phenolic resin, a polyamide resin, a polyimide resin, or the like.

The light-emitting element layer 130 may be arranged on one surface of the circuit driving layer 120. The light-emitting element layer 130 may include the light-emitting element ED. The light-emitting element ED may include an organic light-emitting layer or an inorganic light-emitting layer. The light-emitting element ED may emit light with various levels of luminance according to a driving signal transmitted from the circuit driving layer 120. For example, the light-emitting element ED may include a self-emissive element. The self-emissive element may include at least one of an organic light-emitting diode (LED), a quantum dot LED, an inorganic material-based micro LED (for example, a micro LED), or an inorganic material-based nano LED (for example, a nano LED).

The light-emitting element layer 130 may include a first electrode ANO, a pixel defining film PDL, a light-emitting layer OL, and a second electrode CAT.

The first electrode ANO and the pixel defining film PDL of the light-emitting element ED may be arranged on the fourth insulating layer ILD4.

The first electrode ANO may be a pixel electrode. The first electrode ANO may be an anode. The first electrode ANO may be electrically connected to the drain electrode DE through a contact hole passing through the fourth insulating layer ILD4. In a top emission structure in which light is emitted in a direction of the second electrode CAT with respect to the light-emitting layer OL, the first electrode ANO may be made of a metal material having high reflectivity. For example, the first electrode ANO may have a stacked structure (Ti/Al/Ti) of aluminum and titanium, a stacked structure (ITO/Al/ITO) of aluminum and ITO, an APC alloy, or a stacked structure (ITO/APC/ITO) of an APC alloy and ITO. The APC alloy is an alloy of silver (Ag), palladium (Pd), and copper (Cu). Alternatively, the first electrode ANO may be formed of a single layer made of molybdenum (Mo), titanium (Ti), copper (Cu), or aluminum (Al).

The pixel defining film PDL may cover an edge of the first electrode ANO and expose a central portion thereof. The pixel defining film PDL may be formed of an organic film made of an acrylic resin, an epoxy resin, a phenolic resin, a polyamide resin, a polyimide resin, or the like. According to some embodiments, the pixel defining film PDL may include an inorganic material.

The light-emitting layer OL may be arranged on the first electrode ANO and the pixel defining film PDL. The light-emitting layer OL may include an organic material to emit a certain color. For example, the light-emitting layer OL may include a hole transporting layer, an organic material layer, and an electron transporting layer. According to some embodiments, the light-emitting layer OL may include an inorganic material or a quantum dot material.

The second electrode CAT may be arranged on the light-emitting layer OL. The second electrode CAT may be formed to cover the light-emitting layer OL. The second electrode CAT may be a common electrode. The second electrode CAT may be a cathode of the light-emitting element ED. The second electrode CAT may include a transparent conductive material capable of transmitting light, such as ITO or IZO, or may include a semi-transmissive conductive material.

The thin-film encapsulation layer 140 may be arranged on one surface of the light-emitting element layer 130. The thin-film encapsulation layer 140 may include at least one inorganic film to prevent oxygen or moisture from penetrating into the light-emitting layer OL. In addition, the thin-film encapsulation layer 140 may include at least one organic film to protect the light-emitting layer OL from foreign substances such as dust. For example, the thin-film encapsulation layer 140 may include a first inorganic encapsulation film 141 arranged on the second electrode CAT, an organic encapsulation film 142 arranged on the first inorganic encapsulation film 141, and a second inorganic encapsulation film 143 arranged on the organic encapsulation film 142.

The touch sensing layer 150 may be arranged on one surface of the thin-film encapsulation layer 140. The touch sensing layer 150 may be a layer that detects a touch input and may perform a function of a touch member. The touch sensing layer 150 may include a first sensing electrode layer SL1, an inorganic insulating layer IOL arranged on the first sensing electrode layer SL1, a second sensing electrode layer SL2 arranged on the inorganic insulating layer IOL, and an organic layer ORL arranged on the second sensing electrode layer SL2. The touch sensing layer 150 may be arranged directly on the thin-film encapsulation layer 140, but embodiments are not limited thereto, and according to some embodiments, the touch sensing layer 150 may be attached to the thin-film encapsulation layer 140 in the form of a panel. According to some embodiments, the touch sensing layer 150 may be omitted.

The polarizing layer 160 may be arranged on one surface of the touch sensing layer 150. The polarizing layer 160 may serve to reduce the reflection of external light. The polarizing layer 160 may include a polarizing film. The polarizing film may be attached to a member therebelow through an adhesive layer. The polarizing layer 160 may be omitted. According to some embodiments in which the polarizing layer 160 is omitted, a color filter layer may be arranged on the thin-film encapsulation layer 140.

The protective layer 170 may be arranged on one surface of the polarizing layer 160. The protective layer 170 may include, for example, a window member. The protective layer 170 may be attached to the polarizing layer 160 through an optically transparent adhesive or the like.

The display panel DP may further include a first protective member PF1 and a support member ST.

The first protective member PF1 may be arranged on the other surface of the first substrate 110. The first protective member PF1 may cover the other surface of the first substrate 110 to protect the first substrate 110. The first protective member PF1 may include a film-type member that is stretchable according to bending or rolling of the display panel DP. For example, the first protective member PF1 may be a polymer film layer including a flexible polymeric material such as polyimide. The first protective member PF1 may include a planarization layer made of a polymer resin to planarize an uneven structure of the first supports 111.

The support member ST may be arranged on the other surface of the protective layer 170. The support member ST may perform a function of reinforcing a rigidity of the display panel DP. The support member ST may function as a heat dissipation member. For example, the support member ST may be a metal plate having a small thickness. According to some embodiments, a pattern for reducing a bending rigidity may be formed in the support member ST. According to some embodiments, the support member ST may be implemented as a plurality of unit members rotatably connected to each other.

However, embodiments according to the present disclosure are not limited thereto, and at least one of the first protective member PF1 or the support member ST may be omitted.

With further reference to FIGS. 4 and 5, the first substrate 110 may be partitioned into a first area A1 and a second area A2 having a rigidity lower than that of the first area A1 depending on the rigidity. The rigidity may include a bending rigidity. The bending rigidity may mean a bending moment required to change a curvature. When the display panel DP is rolled, deformation may occur further in the second area A2 than in the first area A1. The first area A1 and the second area A2 may be defined by the plurality of first supports 111 and a plurality of slits H, which will be described in more detail below.

As described above, the first substrate 110 may include the first flexible substrate 112 and the plurality of first supports 111 arranged on the other surface of the first flexible substrate 112.

The first support 111 may be made of a material having a rigidity relatively greater than that of the first flexible substrate 112. The first support 111 may be made of a rigid material such as glass or quartz. For example, the first support 111 may be made of glass and may have a thickness of about 0.1 mm to 0.3 mm. The thickness may mean an average thickness and/or a maximum thickness.

Because the first support 111 is arranged in the first area A1 to a thickness capable of maintaining a rigidity (e.g., a set or predetermined rigidity), the first support 111 and a portion of the first flexible substrate 112 overlapping the first support 111, which are arranged in the first area A1, may have a relatively high rigidity and may be hardly deformed during rolling, and the display panel DP may be rolled around another portion of the first flexible substrate 112 arranged in the second area A2. However, as described below, when the first supports 111 are arranged as one layer, and are arranged to have a sufficiently small thickness in the second area A2, some of the first supports 111 arranged in the second area A2 have flexibility, so that, when the display panel DP is rolled, some of the first supports 111 arranged in the first area A1 may not be bent, and some of the first supports 111 arranged in the second area A2 may be bent.

The plurality of first supports 111 may be arranged on the other surface of the first flexible substrate 112 to be spaced apart from each other. The plurality of slits H may be formed between the plurality of first supports 111. The first supports 111 may be arranged in the first area A1, and the slits H may be arranged in the second area A2.

Each of the first supports 111 and the slits H may have a rectangular shape elongated in the second direction Y in a plan view. The plurality of first supports 111 may be arranged to be spaced apart from each other at regular intervals in the first direction X in a plan view. The plurality of slits H may also be arranged to be spaced apart from each other at regular intervals in the first direction X in a plan view.

The plurality of first supports 111 and the plurality of slits H may be alternately arranged in the first direction X. For example, the plurality of first supports 111 and the plurality of slits H may be arranged so as to form a stripe pattern extending in the second direction Y. The first direction X may be a direction in which the display panel DP is rolled, and the second direction Y may be a direction perpendicular to the direction in which the display panel DP is rolled.

The first support 111 and the slit H may have the same size and may have different sizes. As shown in FIG. 4, the first support 111 and the slit H may have the same area in a plan view, but embodiments according to the present disclosure are not limited thereto. For example, according to various embodiments, the area of the first support 111 may be greater than or less than that of the slit H. Additionally, according to some embodiments, the relatively widths of the first supports 111 may vary between each other, and similarly the relative widths of the slits H may vary between each other according to some embodiments.

The first support 111 and the slit H may each have a small width so that the display panel DP may be rolled with a relatively smaller curvature radius. The width may be a width in the first direction X. For example, a width D1 of the first support 111 in the first direction X and a width D2 of the slit H in the first direction X each may be about 0.1 mm to 2.0 mm.

As shown in FIG. 5, the width D1 of the first support 111 in the first direction X and the width D2 of the slit H in the first direction X may be the same, but embodiments according to present disclosure are not limited thereto. The width D1 of the first support 111 in the first direction X may be greater than or less than the width D2 of the slit H in the first direction X.

As shown in FIG. 5, the plurality of slits H may be arranged to partially expose a lower surface of the first flexible substrate 112. A depth of the slit H may be substantially equal to the thickness of the first support 111. For example, the depth of the slit H may be about 0.1 mm to 0.3 mm.

A thickness D3 of each of the plurality of first supports 111 may be greater than the thickness of the first flexible substrate 112. For example, the thickness D3 of each of the plurality of first supports 111 may be about 0.1 mm to 0.3 mm. According to some embodiments, the thickness D3 of the first support 111 may be equal to or less than the thickness of the first flexible substrate 112.

With further reference to FIG. 6, the first support 111 may include an upper surface 111_US in contact with the lower surface of the first flexible substrate 112, a lower surface 111_LS opposite to the upper surface 111_US, and side surfaces 111_SS connecting the upper surface 111_US and the lower surface 111_LS. In FIG. 6, the upper surface 111_US and the lower surface 111_LS of the first support 111 may extend horizontally and flat, and the side surfaces 111_SS of the first supports 111 may extend vertically and flat, but embodiments according to the present disclosure are not limited thereto. At least one of the upper surface 111_US, the lower surface 111_LS, or the side surfaces 111_SS of the first support 111 may include a curved surface or an inclined surface.

An upper end of the side surface 111_SS may be connected to the upper surface 111_US of the first support 111, and a lower end of the side surface 111_SS may be connected to the lower surface 111_LS of the first support 111. The slit H may be arranged between the side surfaces 111_SS of the first supports 111 that are adjacent to each other.

The first support 111 may further include a curved surface CR, which is convex outward, between the lower end of the side surface 111_SS and the lower surface 111_LS of the first support 111. The curved surface CR may be a corner portion formed by the lower end of the side surface 111_SS and the lower surface 111_LS of the first support 111 that meet in a cross-sectional view.

As shown in FIG. 6, a length of the side surface 111_SS in the third direction Z may be greater than a length of the curved surface CR in the third direction Z, but embodiments according to the present disclosure are not limited thereto. The length of the side surface 111_SS in the third direction Z may be equal to or less than the length of the curved surface CR in the third direction Z.

The width of the slit H in the first direction X may vary depending on the depth of the slit H. As shown in FIG. 6, the width of the slit H in the first direction X may increase in the downward direction. In a cross-sectional view, a width D2 of an upper side opening of the slit H formed between the upper surfaces 111_US of the plurality of first supports 111 may be less than a width D4 of a lower side opening of the slit H formed between the lower surfaces 111_LS of the plurality of first supports 111. The width D2 of the upper side opening of the slit H may be substantially equal to the width D2 of the slit H. According to some embodiments, the width D2 of the upper side opening of the slit H formed between the upper surfaces 111_US of the first supports 111 may be equal to or greater than a width D2_1 of the lower side opening of the slit H formed between the lower surfaces 111_LS of the first support 111. The width D2 of the upper side opening may mean a minimum width between the plurality of first supports 111 in the first direction X.

The display panel DP of the display device 1 according to some embodiments may improve mechanical strength and flexibility while ensuring excellent surface quality. For example, the substrate of the flexible display panel DP may be made of a relatively rigid material such as glass or a flexible material such as polyimide. When the substrate is made of a rigid material, the substrate may have relatively excellent surface quality, but it is disadvantageous in terms of mechanical strength and flexibility. When the substrate is made of a flexible material, it is advantageous in terms of mechanical strength and flexibility, but the surface quality may be reduced. The display device 1 according to some embodiments may have relatively improved mechanical strength and flexibility compared to a case in which the substrate is made of only a rigid material, and may secure the surface quality superior to a case in which the substrate is made of only a flexible material, by arranging the plurality of first supports 111 made of a rigid material on the other surface of the first flexible substrate 112 to form a pattern in which the rigidity of the first substrate 110 may be appropriately adjusted.

Figure 7:
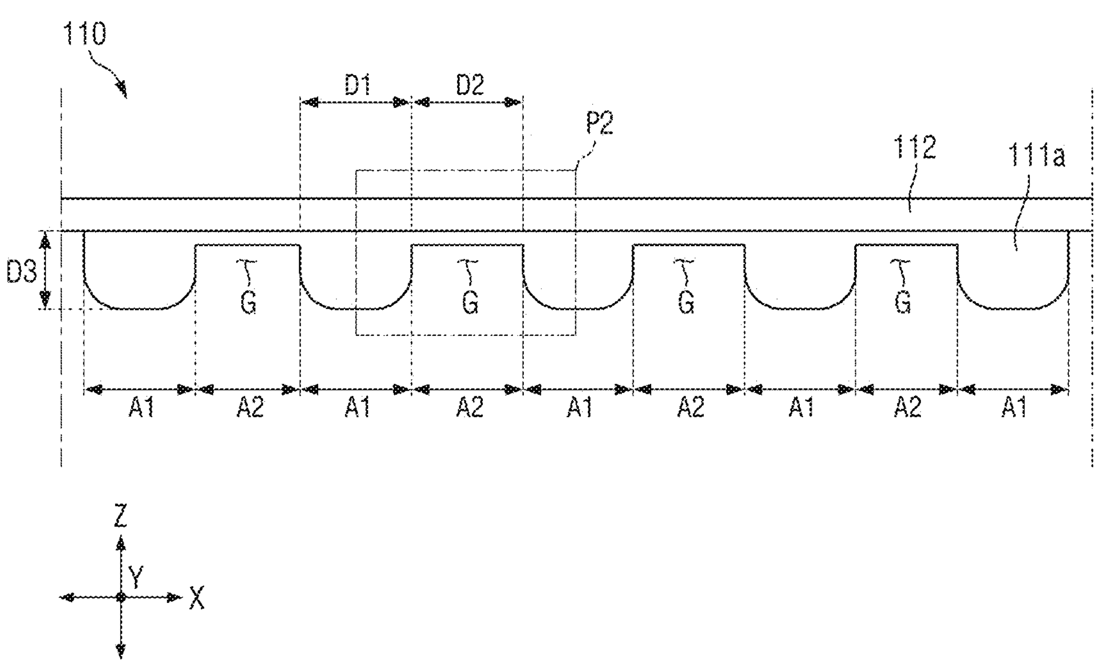
FIG. 7 is a cross-sectional view of a first substrate of a display device according to some embodiments.
Figure 8:
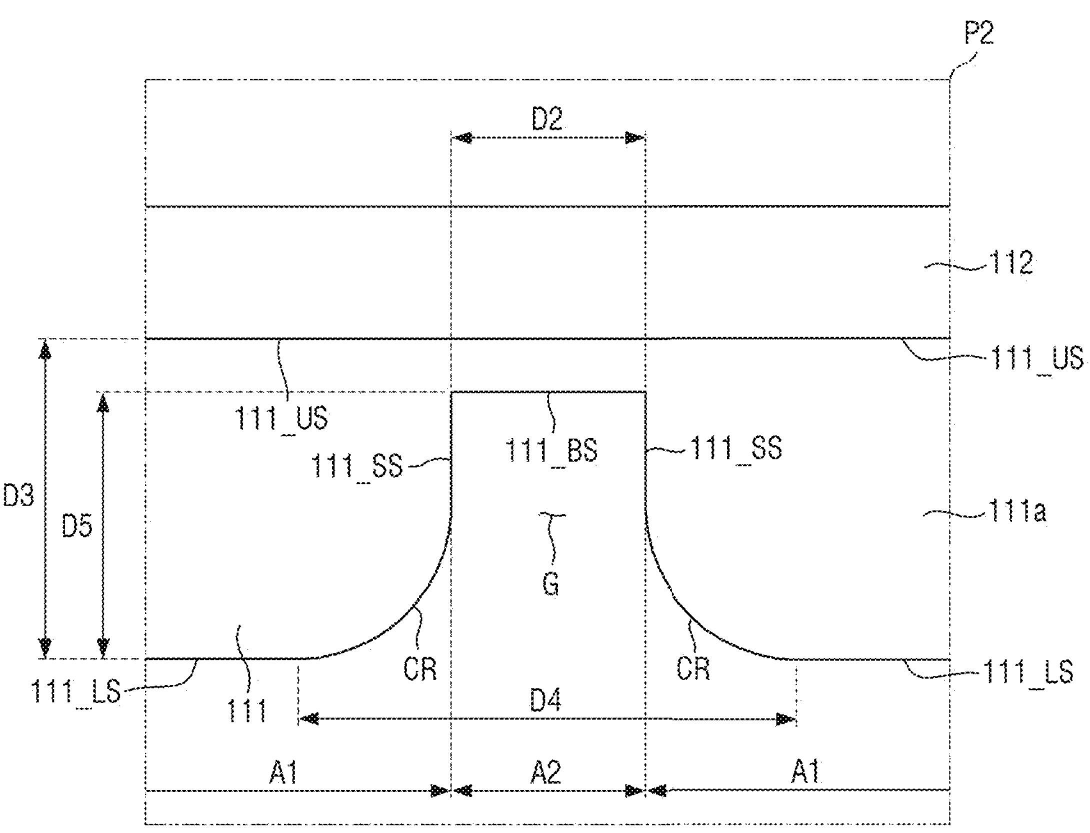
FIG. 8 is an enlarged cross-sectional view of portion "P2" of FIG. 7.

FIG. 7 is a cross-sectional view of a first substrate of a display device according to some embodiments. FIG. 8 is an enlarged cross-sectional view of portion "P2" of FIG. 7.

The embodiments described with reference to FIG. 7 are different from the embodiments described with reference to FIG. 1 to FIG. 6 in that a first support 111*a* is formed as one layer, and a plurality of grooves G are formed in the first support 111*a*.

Referring to FIGS. 7 and 8, the first support 111*a* may be integrally arranged to form one layer throughout a plurality of first areas A1 and a plurality of second areas A2. That is, according to some embodiments, the first support 111*a* may be formed as a cohesive or integrally formed component or body that extends across the plurality of first areas A1 and the plurality of second areas A2. The first support 111*a* may cover the lower surface of the first flexible substrate 112 so that the lower surface of the first flexible substrate 112 arranged in the second area A2 is not exposed downward.

The groove G recessed upward from a lower surface of the first support 111*a* may be arranged in each of the plurality of second areas A2. Accordingly, unevenness may be formed on the lower surface of the first support 111*a*. According to some embodiments, the plurality of grooves G may be arranged to be spaced apart from each other in the first direction X on a plane similar to the plurality of slits H shown in FIG. 4, and may be arranged to form a stripe pattern extending in the second direction Y.

The groove G may be formed by removing a portion of the first support 111*a* arranged in the plurality of second areas A2. As shown in FIGS. 7 and 8, a cross section of the groove G may have an approximately rectangular shape, but embodiments according to the present disclosure are not limited thereto. For example, the groove G may have various shapes such as a square shape, a semi-elliptical shape, a semi-circular shape, a saw-toothed shape, a trapezoidal shape, and the like.

The plurality of grooves G may be arranged at regular intervals, but embodiments according to the present disclosure are not limited thereto. For example, the plurality of grooves G may be arranged at variable intervals to have a predetermined tendency or arranged at irregular intervals.

A thickness D3 of the first support 111*a* may vary depending on an area in which the first support 111*a* is arranged. The thickness of the first support 111*a* in the first area A1 may be greater than the thickness of the first support 111*a* in the second area A2.

In an example, the thickness D3 of the first support 111*a* may range from about 1.0 mm to 3.0 mm in the first area A1, and may be about 100 μm or less in the second area A2. In another example, the thickness D3 of the first support 111*a* may be about 30 μm or less in the second area A2. In still another example, the thickness D3 of the first support 111*a* may greater than or equal to the thickness of the first flexible substrate 112 in the first area A1, and the thickness D3 of the first support 111*a* may be less than or equal to the thickness of the first flexible substrate 112 in the second area A2.

As described above, because the first support 111*a* is implemented as a thin film or ultra-thin film having a thickness of about 100 μm or less in the second area A2, even when the first support 111*a* is made of a rigid material, the first support 111*a* may be integrally bent or rolled together with the first flexible substrate 112 when the display panel DP is bent or rolled.

As shown in FIG. 8, the first support 111*a* may include an upper surface 111_US in contact with the lower surface of the first flexible substrate 112 and a lower surface 111_LS opposite to the upper surface 111_US.

The groove G may include two side surfaces 111_SSa extending upward (in the thickness direction) from the lower surfaces 111_LS of the first supports 111*a* and a bottom surface 111_BSa connecting an upper end of each of the two side surfaces 111_SSa. The two side surfaces 111_SSa and the bottom surface 111_BSa may form an inner side surface of the groove G.

The two side surfaces 111_SSa and the bottom surface 111_BSa may be arranged in an upwardly concave shape. A curved surface that is convex outward may be formed between the side surface 111_SSa of the groove G and the lower surface 111_LS of the first support 111*a*.

In FIG. 8, the upper surface 111_US and the lower surface 111_LS of the first support 111*a* and the bottom surface 111_BSa of the groove G may extend horizontally and flat, and the side surfaces 111_SSa of the groove G may extend vertically and flat, but embodiments according to the present disclosure are not limited thereto. At least one of the upper surface 111_US or the lower surface 111_LS of the first support 111*a* or the side surfaces 111_SSa of the groove G may include a curved surface or an inclined surface.

The embodiments described with reference to FIG. 7 are the same as or similar to the embodiments described with respect to FIG. 5 except that the first support 111*a* is formed as one layer, and the plurality of grooves G are formed in the first support 111*a*, and thus in the following, some redundant descriptions may be omitted.

Figure 9:
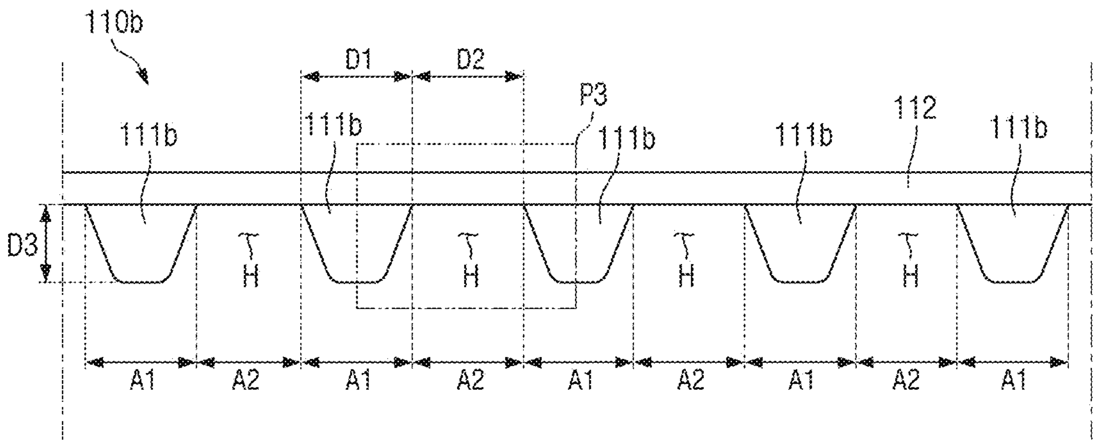
FIG. 9 is a cross-sectional view of a first substrate of a display device according to some embodiments.
Figure 9:
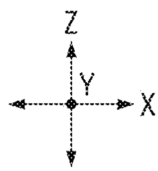
Figure 10:
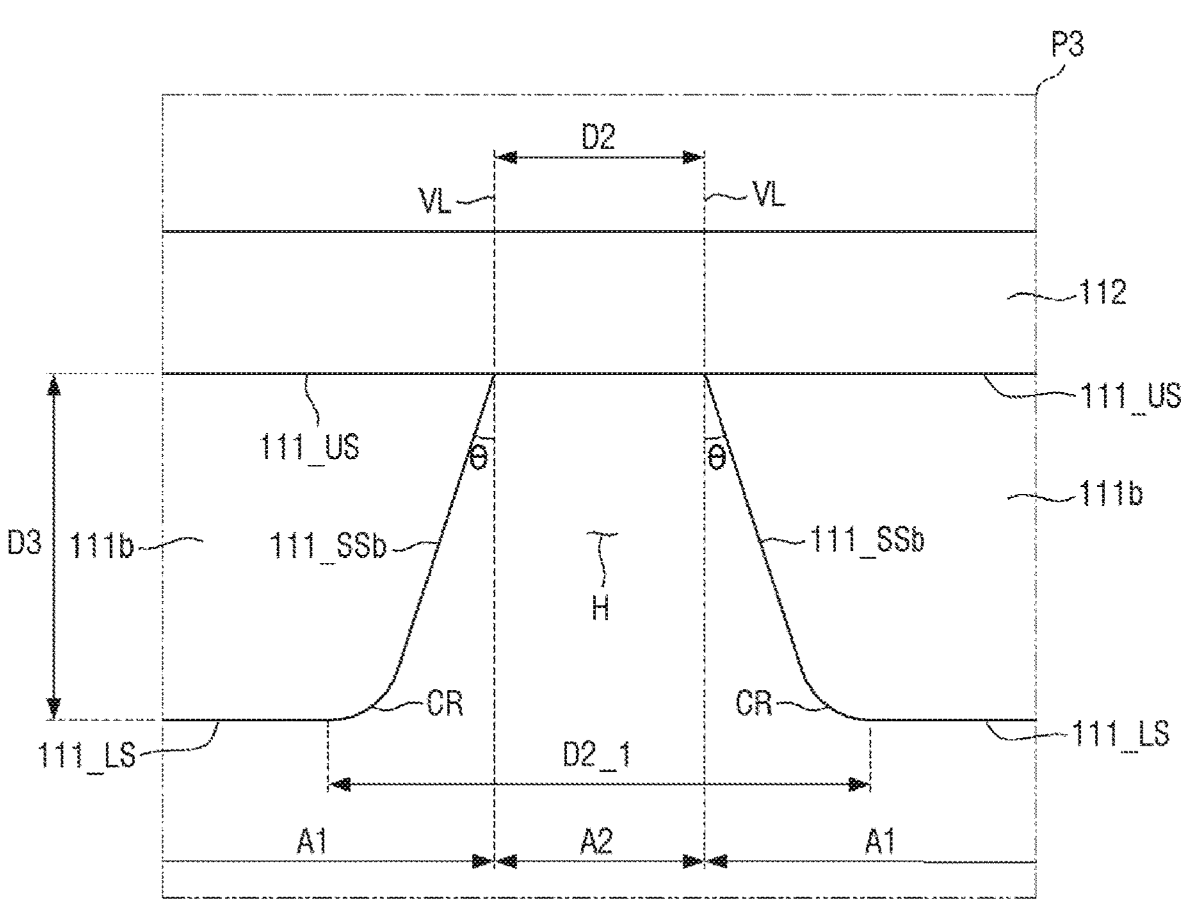
FIG. 10 is an enlarged cross-sectional view of portion "P3" of FIG. 9.
Figure 11:
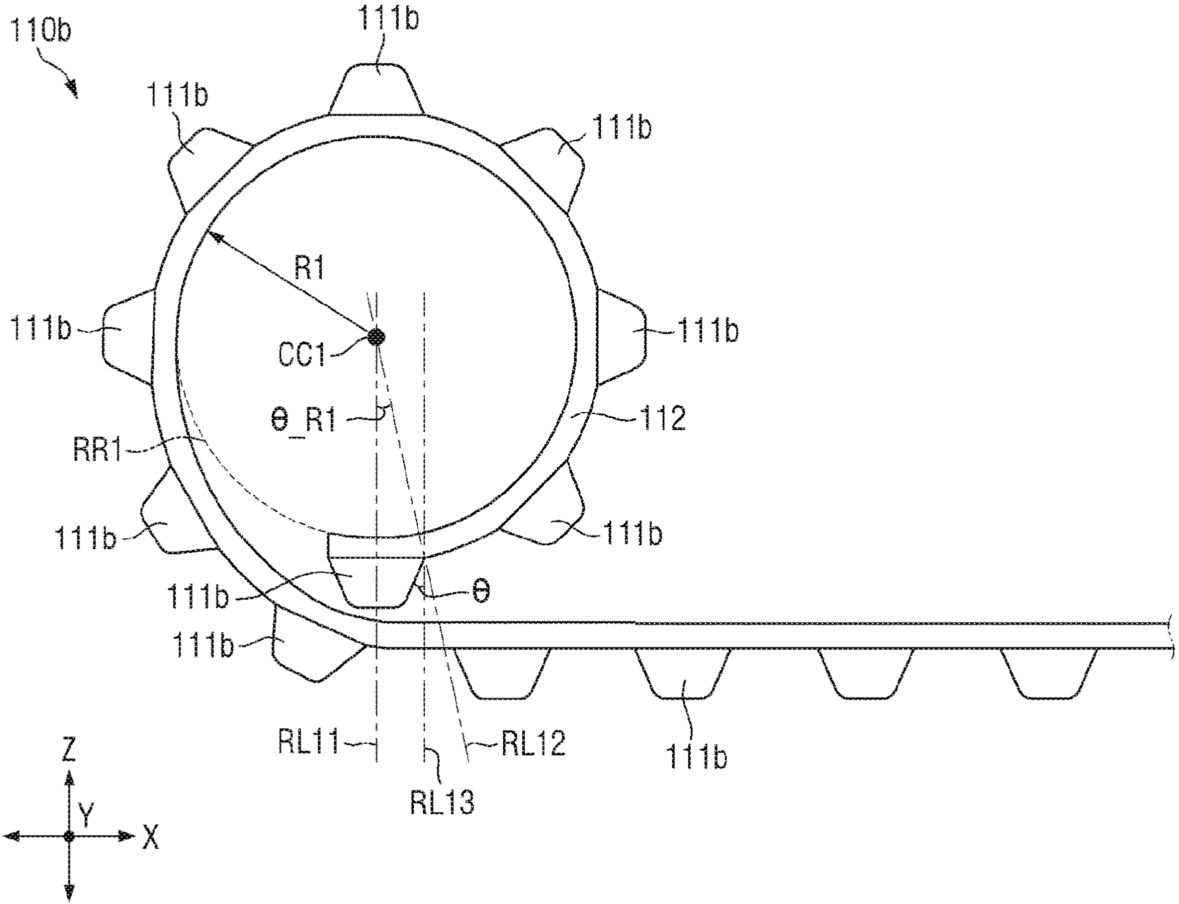
FIG. 11 is a cross-sectional view illustrating a state in which the first substrate of FIG. 9 is bent in an upward direction and rolled.
Figure 12:
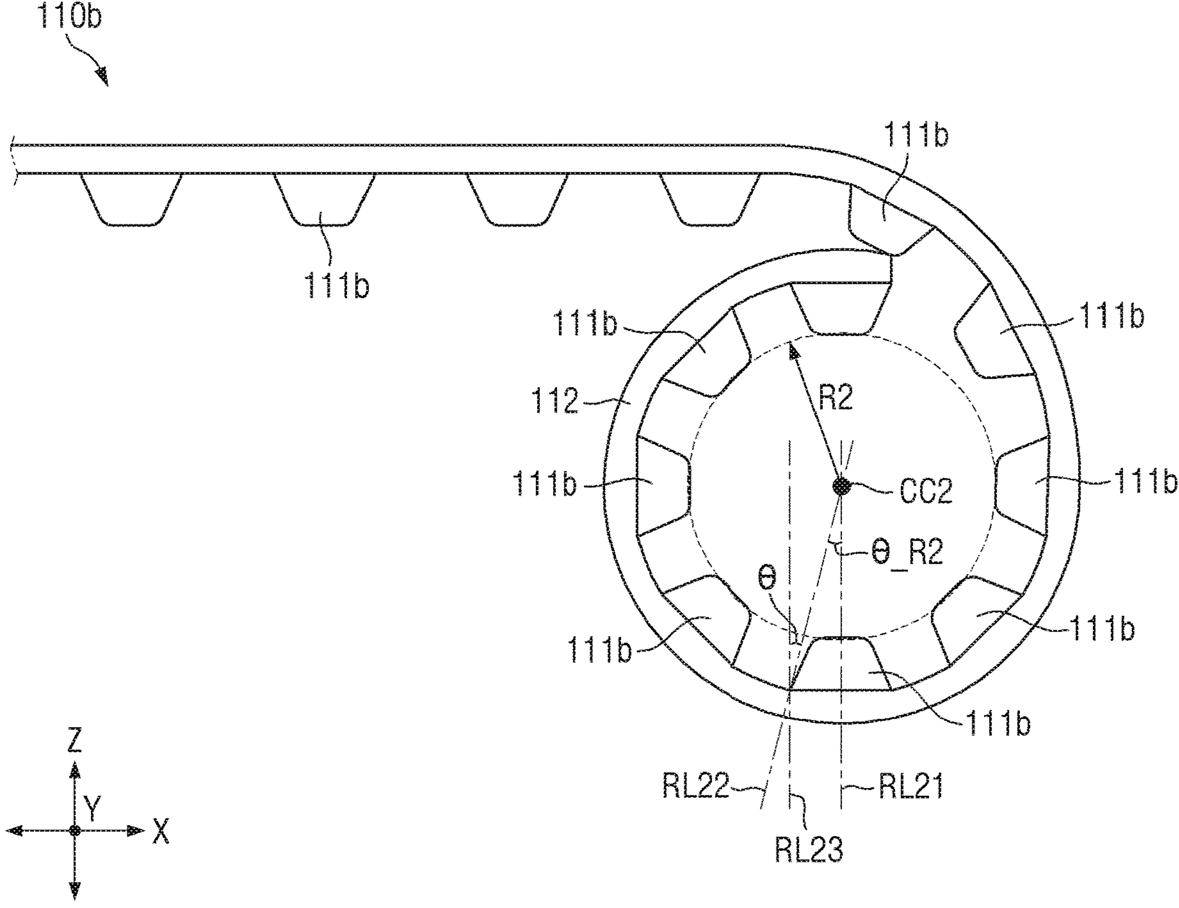
FIG. 12 is a cross-sectional view illustrating a state in which the first substrate of FIG. 9 is bent in a downward direction and rolled.

FIG. 9 is a cross-sectional view of a first substrate of a display device according to some embodiments. FIG. 10 is an enlarged cross-sectional view of portion “P3” of FIG. 9. FIG. 11 is a cross-sectional view illustrating a state in which the first substrate of FIG. 9 is bent in the upward direction and rolled. FIG. 12 is a cross-sectional view illustrating a state in which the first substrate of FIG. 9 is bent in the downward direction and rolled.

For convenience of description, in FIGS. 11 and 12, other components of the display panel DP other than the first flexible substrate 112 and a first support 111*b* are omitted.

The example embodiments described with reference to FIG. 9 are different from the example embodiments described with reference to FIG. 5 in that side surfaces 111_SSb of the first support 111*b* are arranged to be inclined.

Referring to FIG. 9, a first substrate 110*b* may include a plurality of first areas A1 and a plurality of second areas A2 each having a rigidity less than that of the first area A1.

A plurality of first supports 111*b* may be arranged in the plurality of first areas A1, respectively. A plurality of slits H may be formed in the plurality of second areas A2, respectively.

Referring to FIGS. 9 and 10, each of the plurality of first supports 111*b* may include an upper surface 111_US in contact with the lower surface of the first flexible substrate 112, a lower surface 111_LS opposite to the upper surface 111_US, and the side surfaces 111_SSb connecting the upper surface 111_US and the lower surface 111_LS. The side surface 111_SSb and the lower surface 111_LS may be connected by a curved surface CR that is convex outward.

The upper surface 111_US and the lower surface 111_LS of the first support 111*b* may be arranged parallel to the first direction X. The first direction X may be a direction in which the first flexible substrate 112 extends. The first direction X may be a horizontal direction.

The side surface 111_SSb of the first support 111*b* may be arranged to be inclined with respect to the first direction X. That is, the side surface 111_SSb of the first support 111*b* may be arranged to be inclined with respect to the upper surface 111_US and the lower surface 111_LS of the first support 111*b*. In more detail, the side surface 111_SSb of the first support 111*b* may be arranged to form an angle (e.g., a set or predetermined angle) θ with a vertical line VL perpendicular to the upper surface and/or the lower surface of the first flexible substrate 112. The vertical line VL may pass through an edge of the first support 111*b*. The edge of the first support 111*b* may be an outermost end of the first support 111*b*.

As shown in FIG. 9, the side surfaces 111_SSb of the first support 111*b* may have the same slope, but embodiments according to the present disclosure are not limited thereto. The slope of the side surface 111_SSb may be varied according to a relative position of the side surface 111_SSb. For example, the slope of the side surface 111_SSb may increase or decrease from the upper surface 111_US of the first support 111*b* to the lower surface 111_LS of the first support 111*b*.

The side surface 111_SSb of the first support 111*b* may be inclined so that a width of the slit H increases from the upper surface 111_US of the first support 111*b* to the lower surface 111_LS of the first support 111*b*. That is, the slit H may have a tapered shape so that the width increases in the downward direction in a cross-sectional view. Accordingly, a width D1 of the first support 111*b* in the first direction X may decrease as a distance from the first flexible substrate 112 increases. The first direction X may be a direction parallel to the upper or lower surface of the first flexible substrate 112.

In a cross-sectional view, a width D2 of an upper side opening of the slit H formed between the upper surfaces 111_US of the plurality of first supports 111*b* may be less than a width D2_1 of a lower side opening of the slit H formed between the lower surfaces 111_LS of the plurality of first supports 111*b*. A distance of both sides of the first support 111*b* adjacent to the second areas A2 may decrease as the both sides are closer to the second areas A2.

The side surfaces 111_SSb of the first support 111*b* may be arranged to have a constant slope, but embodiments according to the present disclosure are not limited thereto. The slope of the side surface 111_SSb of the first support 111*b* may be varied in the thickness direction. For example, the side surface 111_SSb of the first support 111*b* may include at least one convex surface or concave surface.

In the following FIGS. 11 and 12, the rolling of only the first substrate 110*b* of the display panel DP is shown, but, when the display panel DP is rolled, the circuit driving layer 120, the light-emitting element layer 130, the thin-film encapsulation layer 140, the touch sensing layer 150, the polarizing layer 160, and the protective layer 170, which are arranged on one surface of the first substrate 110*b*, and the first protective member PF1, the support member ST, and the like, which are arranged on the other surface of the first substrate 110*b*, may be integrally rolled together with the first substrate 110*b*.

Referring to FIG. 11, the display panel DP may be bent in the upward direction and rolled, as described above. In this case, the display panel DP may be rolled about a first rolling axis CC1 located on an upper surface side of the display panel DP. For example, the display panel DP may be wound on a first roller RR1 having a first radius of curvature R1 with respect to the first rolling axis CC1. The first rolling axis CC1 is a virtual axis extending in the second direction Y, and a curvature center of the first radius of curvature R1 may be located on the first rolling axis CC1.

When the display panel DP is rolled about the first rolling axis CC1, a first reference line RL11, a second reference line RL12, and a third reference line RL13 may be defined in a cross-sectional view.

Referring to FIGS. 9 to 11, the first reference line RL11 may be a virtual line extending in a radial direction from the first rolling axis CC1 so as to bisect the first area A1 and/or the first support 111*b*. The first reference line RL11 may be perpendicular to the upper surface and/or the lower surface of the first flexible substrate 112 overlapping the first area A1 or the first support 111*b* in the thickness direction.

The second reference line RL12 may be a virtual line extending in the radial direction from the first rolling axis CC1 so as to pass through an edge of the first support 111*b*. The edge of the first support 111*b* may mean an outermost end of the first support 111*b* at which the upper surface 111_US of the first support 111*b* meets the side surface 111_SSb connected to the upper surface 111_US. In FIG. 11, the second reference line RL12 passes through a right edge of the first support 111*b*, but embodiments according to the present disclosure are not limited thereto. The second reference line RL12 may also pass through a left edge of the first support 111*b*.

The second reference line RL12 may be perpendicular to a tangent line in contact with one point on the lower surface of the first flexible substrate 112 on which the edge of the first support 111*b* is located. When the display panel DP is unfolded flat, the second reference line RL12 may be substantially the same as the vertical line VL of FIG. 10.

The third reference line RL13 may be a virtual line parallel to the first reference line RL11 and passing through the edge of the first support 111*b*. The third reference line RL13 may cross the second reference line RL12 at the edge of the first support 111*b*.

As shown in FIGS. 10 and 11, the side surface 111_SSb of the first support 111*b* may be inclined to have an angle (e.g., a set or predetermined angle) θ with the third reference line RL13. The angle (e.g., the set or predetermined angle) θ may be greater than or equal to a first reference angle θ_R1, which is formed between the first reference line RL11 and the second reference line RL12, with respect to the first rolling axis CC1.

When the first reference angle θ_R1 is relatively large, and/or the first support 111*b* is arranged on the lower surface of the first flexible substrate 112 to have a relatively large width and/or area compared to the first radius of curvature R1, the angle (e.g., the set or predetermined angle) θ may be increased. In this case, the sharpness of a corner portion formed by the side surface 111_SSb and the lower surface 111_LS of the first support 111*b* may be relatively reduced.

When the first reference angle θ_R1 is relatively small, and/or the first support 111*b* is arranged on the lower surface of the first flexible substrate 112 to have a relatively small width and/or area compared to the first radius of curvature R1, the angle (e.g., the set or predetermined angle) θ may be reduced. In this case, the sharpness of the corner portion formed by the side surface 111_SSb and the lower surface 111_LS of the first support 111*b* may be relatively increased.

That is, the side surface 111_SSb of the first support 111*b* is inclined to have the angle (e.g., the set or predetermined angle) θ corresponding to the first reference angle θ_R1, so that the sharpness of the corner portion formed by the side surface 111_SSb and the lower surface 111_LS of the first support 111*b* may be adjusted according to the magnitude of the radius of curvature at which the display panel DP is rolled. Accordingly, when the display panel DP is rolled, damage and/or deformation may be minimized, which may occur when the first support 111*b* comes into contact with other components of the display panel DP stacked on the first substrate 110*b*, for example, the first protective member PF1, the protective layer 170, and the like.

Referring to FIG. 12, the display panel DP may be bent in the downward direction and rolled, as described above. In this case, the display panel DP may be rolled about a second rolling axis CC2 located on a lower surface 111_LS of the display panel DP. For example, the display panel DP may be wound on a second roller RR2 having a second radius of curvature R2 with respect to the second rolling axis CC2. The second rolling axis CC2 is a virtual axis extending in the second direction Y, and a curvature center of the second radius of curvature R2 may be located on the second rolling axis CC2.

When the display panel DP is rolled about the second rolling axis CC2, a fourth reference line RL21, a fifth reference line RL22, and a sixth reference line RL23 may be defined in a cross-sectional view.

Referring to FIGS. 9, 10, and 12, the fourth reference line RL21 may be a virtual line extending in a radial direction from the second rolling axis CC2 so as to bisect the first area A1 and/or the first support 111*b*. The fourth reference line RL21 may be perpendicular to the upper surface and/or the lower surface of the first flexible substrate 112 overlapping the first support 111*b* in the thickness direction.

The fifth reference line RL22 may be a virtual line extending in the radial direction from the second rolling axis CC2 so as to pass through an edge of the first support 111*b*. The edge of the first support 111*b* may mean an outermost end of the first support 111*b* at which the upper surface 111_US of the first support 111*b* meets the side surface 111_SSb connected to the upper surface 111_US. In FIG. 12, the fifth reference line RL22 passes through a left edge of the first support 111*b*, but the fifth reference line RL22 may pass through a right edge of the first support 111*b*. When the display panel DP is unfolded flat, the fifth reference line RL22 may be substantially equal to the vertical line VL of FIG. 10.

The sixth reference line RL23 may be a virtual line parallel to the fourth reference line RL21 and passing through the edge of the first support 111*b*. The sixth reference line RL23 may cross the fifth reference line RL22 at the edge of the first support 111*b*.

As shown in FIGS. 10 and 12, the side surface 111_SSb of the first support 111*b* may be inclined to have an angle (e.g., a set or predetermined angle) θ with the sixth reference line RL23. The angle (e.g., the set or predetermined angle)

θ may be greater than or equal to a second reference angle θ_R2, which is formed between the fourth reference line RL21 and the fifth reference line RL22, with respect to the second rolling axis CC2.

When the second reference angle θ_R2 is relatively large, and/or the first support 111b is arranged on the lower surface of the first flexible substrate 112 to have a relatively large width and/or area for the second radius of curvature R2, the angle (e.g., the set or predetermined angle) θ may be increased. In this case, the sharpness of the corner portion formed by the side surface 111_SSb and the lower surface 111_LS of the first support 111b may be relatively reduced.

When the second reference angle θ_R2 is relatively small, and/or the first support 111b is arranged on the lower surface of the first flexible substrate 112 to have a relatively small width and/or area for the second radius of curvature R2, the angle (e.g., the set or predetermined angle) θ may be reduced. In this case, the sharpness of the corner portion formed by the side surface 111_SSb and the lower surface 111_LS of the first support 111b may be relatively increased.

That is, the side surface 111_SSb of the first support 111b is inclined to have the angle (e.g., the set or predetermined angle) θ corresponding to the second reference angle θ_R2, so that the sharpness of the corner portion formed by the side surface 111_SSb and the lower surface 111_LS of the first support 111b may be adjusted according to the size of the first support 111b and the magnitude of the radius of curvature at which the display panel DP is rolled. Accordingly, when the display panel DP is rolled, damage may be minimized or reduce, which may otherwise occur when the first support 111b comes into contact with other components of the display panel DP stacked on the first substrate 110b, for example, the first protective member PF1, the protective layer 170, and the like.

Further, the corner portion, which is formed by the side surface 111_SSb and the lower surface 111_LS of the first support 111b that meet, is retracted from the fifth reference line RL22 so as to be located between the fourth reference line RL21 and the fifth reference line RL22, so that the plurality of first supports 111b may be prevented from being brought into contact with each other when the display panel DP is rolled.

Figure 13:
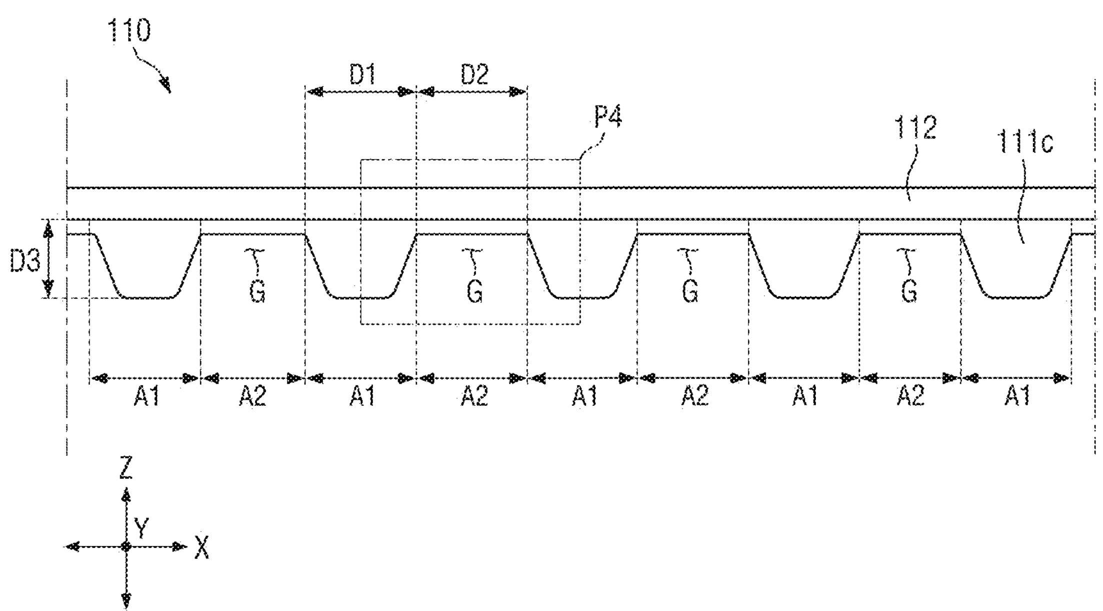
FIG. 13 is a cross-sectional view of a first substrate of a display device according to some embodiments.
Figure 14:
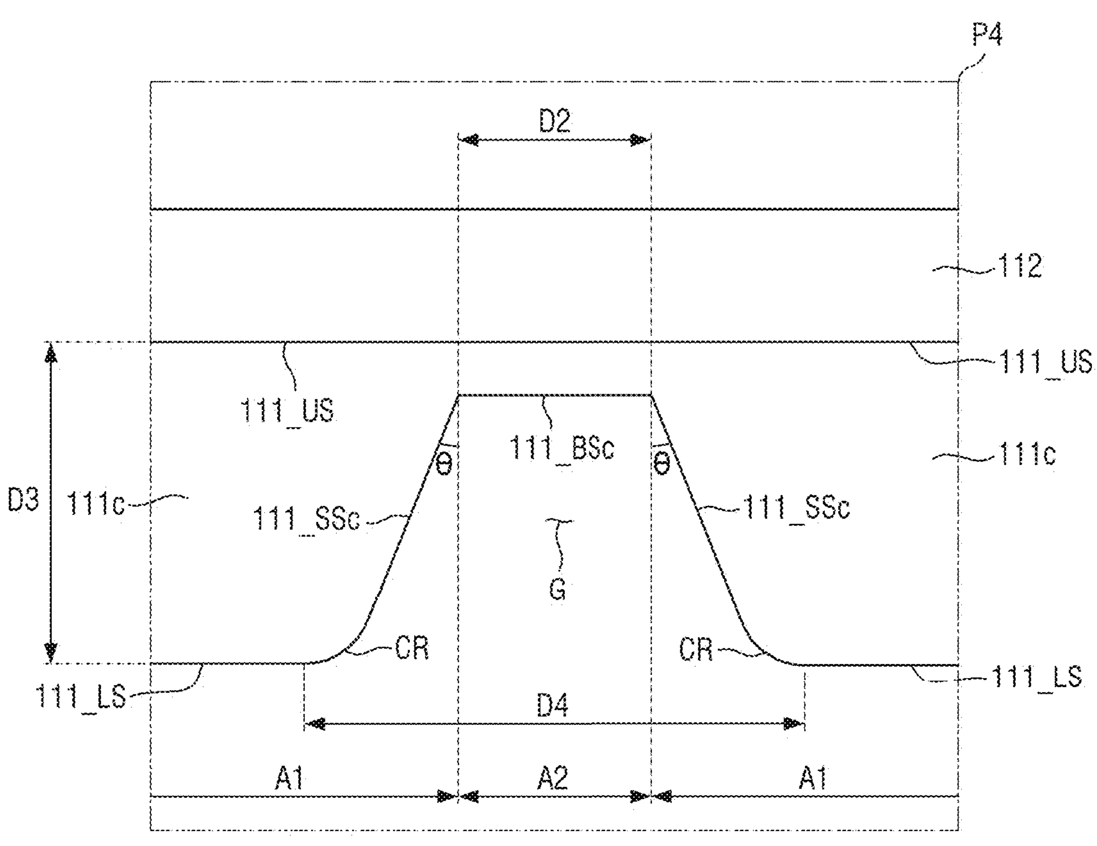
FIG. 14 is an enlarged cross-sectional view of portion "P4" of FIG. 13.

FIG. 13 is a cross-sectional view of a first substrate of a display device according to some embodiments. FIG. 14 is an enlarged cross-sectional view of portion "P4" of FIG. 13.

The embodiments described with reference to FIG. 13 are different from the embodiments described with reference to FIG. 9 to FIG. 12 in that a first support 111c is formed as one layer, and a groove G is formed in a second area A2.

Referring to FIGS. 13 and 14, the first support 111c may be integrally arranged to form one layer throughout a plurality of first areas A1 and a plurality of second areas A2.

The first support 111c may cover the lower surface of the first flexible substrate 112 so that the lower surface of the first flexible substrate 112 arranged in the second area A2 is not exposed downward.

As in the embodiments described with reference to FIG. 7, a groove G recessed upward from a lower surface of the first support 111c may be arranged in each of the plurality of second areas A2. Accordingly, unevenness may be formed on the lower surface of the first support 111c. According to some embodiments, the plurality of grooves G may be arranged to be spaced apart from each other in the first direction X on a plane similar to the plurality of slits H shown in FIG. 4, and may be arranged to form a stripe pattern extending in the second direction Y.

The groove G may be formed by removing a portion of the first support 111c arranged in the plurality of second areas A2. The plurality of grooves G may be arranged at regular intervals, but embodiments according to the present disclosure are not limited thereto. The plurality of grooves G may be arranged at variable intervals to have a predetermined tendency or arranged at irregular intervals.

A thickness D3 of the first support 111c may vary depending on an area in which the first support 111c is arranged. The thickness D3 of the first support 111c in the first area A1 may be greater than the thickness D3 of the first support 111c in the second area A2.

In an example, the thickness D3 of the first support 111c may range from about 1.0 mm to 3.0 mm in the first area A1, and may be about 100 μm or less in the second area A2. In another example, the thickness D3 of the first support 111c may be about 30 μm or less in the second area A2. In still another example, the thickness D3 of the first support 111c may greater than or equal to the thickness of the first flexible substrate 112 in the first area A1, and may be less than or equal to the thickness of the first flexible substrate 112 in the second area A2.

As shown in FIG. 14, the first support 111c may include an upper surface 111_US in contact with the lower surface of the first flexible substrate 112 and a lower surface 111_LS opposite to the upper surface 111_US.

The groove G may include two side surfaces 111_SSc extending upward (in the thickness direction) from the lower surface 111_LS of the first support 111c and a bottom surface 111_BSc connecting an upper end of each of the two side surfaces 111_SSc. The two side surfaces 111_SSc and the bottom surface 111_BSc may be arranged in an upwardly concave shape. The two side surfaces 111_SSc and the bottom surface 111_BSc may form an inner side surface of the groove. A curved surface that is convex outward may be formed between the side surface 111_SSc and the lower surface 111_LS of the first support 111c.

As in the embodiments described with reference to FIG. 9 to FIG. 12, the side surface 111_SSc of the groove G may be arranged to be inclined with respect to the first direction X in the state where the first substrate 110b is flat. That is, the side surface 111_SSc of the groove G may be arranged to be inclined with respect to the upper surface 111_US and the lower surface 111_LS of the first support 111c. The side surface 111_SSc of the groove G may be inclined so that a width of the groove G increases from the upper surface 111_US of the first support 111c to the lower surface 111_LS of the first support 111c.

The side surface 111_SSc of the groove G may be arranged to form an angle (e.g., a set or predetermined angle) θ with a vertical line VL perpendicular to the upper surface and/or the lower surface of the first flexible substrate 112. The relationship between the angle (e.g., the set or predetermined angle) θ and the radius of curvature at which the display module is rolled may be substantially equal to or similar to that in FIGS. 10 and 11.

For example, the second reference line RL12, the third reference line RL13, the fifth reference line RL22, and the sixth reference line RL23, which are described above with reference to FIGS. 11 and 12 may be defined based on a boundary between the first area A1 and the second area A2 and/or a boundary between the side surface 111_SSc and the bottom surface 111_BSc of the first support 111c instead of the edge of the first support 111b.

The embodiments described with reference to FIG. 13 may be substantially the same as or similar to the example embodiments described with reference to FIG. 9 except that the first support 111*c* is arranged as one layer, and the groove G is formed in the second area A2, and thus in the following, some redundant descriptions may be omitted.

Figure 15:
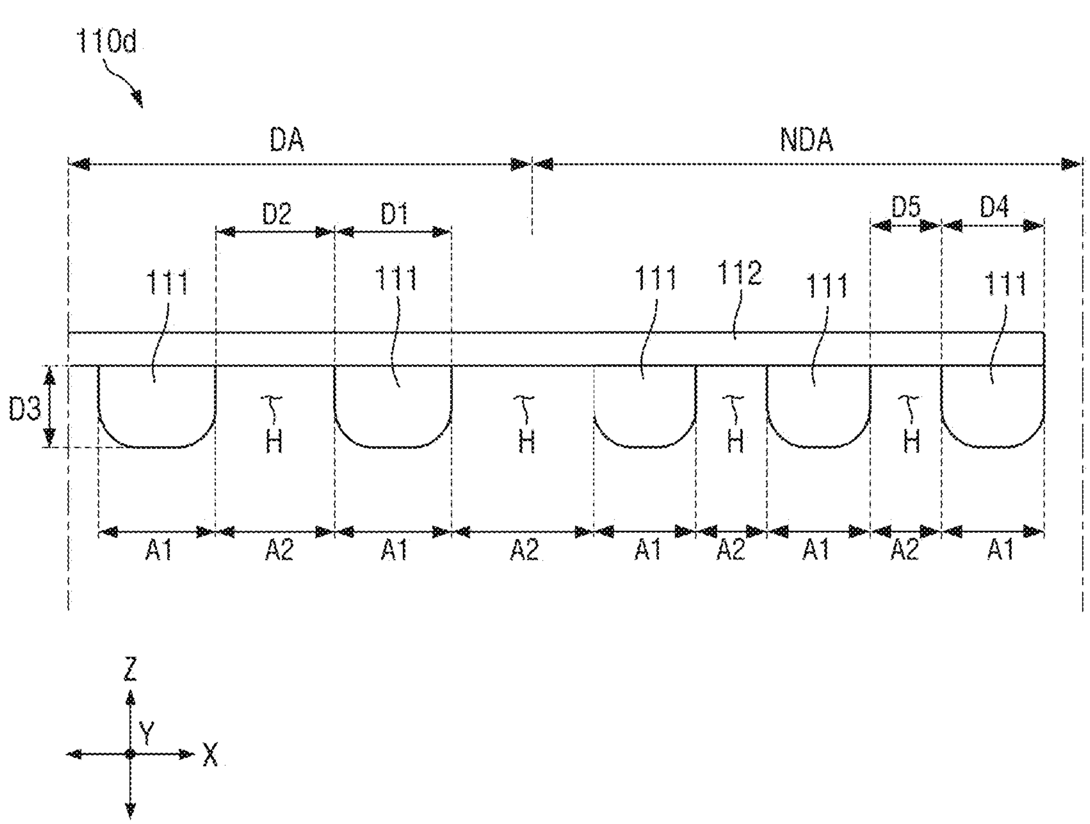
FIG. 15 is a cross-sectional view of a first substrate of a display device according to some embodiments.

FIG. 15 is a cross-sectional view of a first substrate of a display device according to some embodiments.

Referring to FIG. 15, a width D1, in the first direction X, of at least one first support 111 arranged in the display area DA among a plurality of first supports 111 may be different from a width D4, in the first direction X, of at least one first support 111 arranged in the non-display area NDA.

For example, the width D4 of the first support 111 arranged in the non-display area NDA may be less than the width D1 of the first support 111 arranged in the display area DA. Accordingly, an edge portion of a first substrate 110*d*, which is arranged in the non-display area NDA, may be rolled to have a smaller radius of curvature. However, embodiments according to the present disclosure are not limited thereto, and the width D4 of the first support 111 arranged in the non-display area NDA may be greater than or equal to the width D1 of the first support 111 arranged in the display area DA.

A separation distance D2 between the first supports 111, which are arranged in the display area DA, in the first direction X may be different from a separation distance D5 between the first supports 111, which are arranged in the non-display area NDA, in the first direction X.

For example, the separation distance D5 between the first supports 111 arranged in the non-display area NDA may be less than the separation distance D2 between the first supports 111 arranged in the display area DA. Accordingly, an edge portion of the first substrate 110*d*, which is arranged in the non-display area NDA, may be rolled to have a smaller radius of curvature. However, embodiments according to the present disclosure are not limited thereto, and the separation distance D5 between the first supports 111 arranged in the non-display area NDA may be greater than or equal to the separation distance D2 between the first supports 111 arranged in the display area DA.

The first support 111 arranged adjacent to an edge of the first flexible substrate 112 may be arranged to be aligned with the edge of the first flexible substrate 112. The first support 111 may be located in the non-display area NDA. One side edge of the first support 111 adjacent to the edge of the first flexible substrate 112 may overlap the first flexible substrate 112 in the thickness direction. Accordingly, the rigidity of the edge of the first flexible substrate 112 may be improved.

The embodiments described with reference to FIG. 15 may be substantially the same as or similar to the embodiments described with reference to FIG. 5 except for the width and/or interval of each of the plurality of first supports 111, and thus in the following, some redundant descriptions may be omitted.

Figure 16:
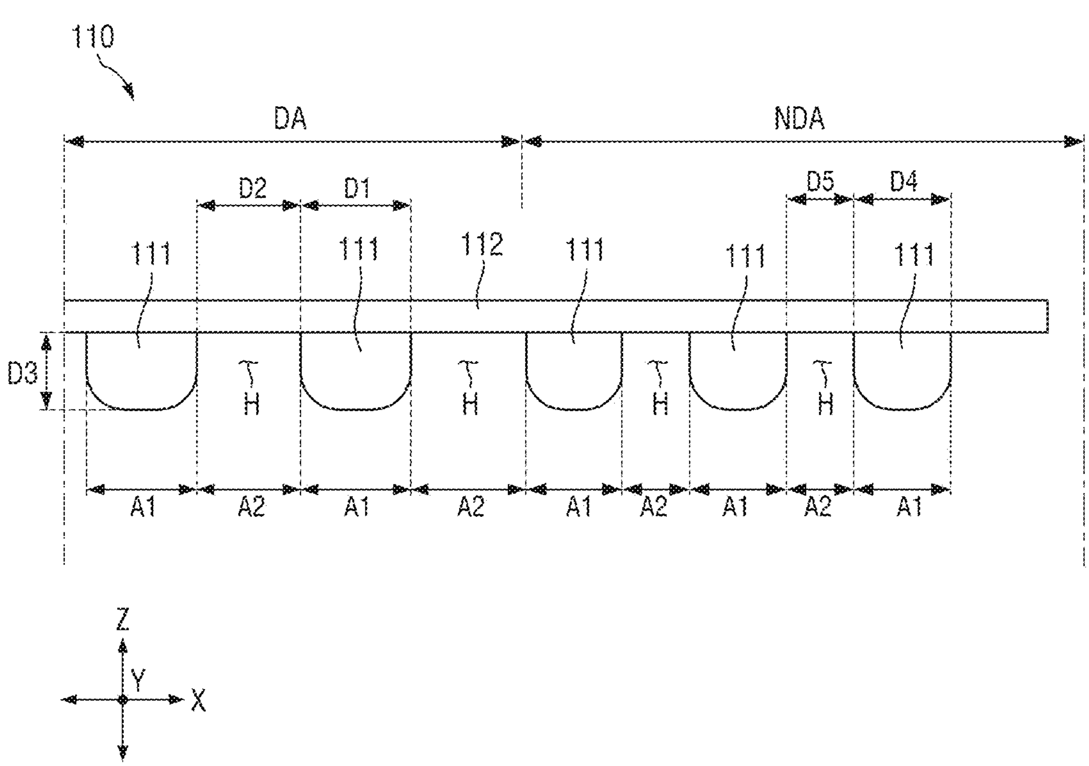
FIG. 16 is a cross-sectional view of a first substrate of a display device according to some embodiments.

FIG. 16 is a cross-sectional view of a first substrate of a display device according to some embodiments.

Referring to FIG. 16, a first support 111, which is arranged adjacent to the edge of the first flexible substrate 112, may be arranged to be spaced apart from the edge of the first flexible substrate 112 in the first direction X. One side edge of the first support 111 adjacent to the edge of the first flexible substrate 112 may not overlap the first flexible substrate 112 in the thickness direction. Accordingly, damage and/or deformation of the first support 111 arranged adjacent to the edge of the first flexible substrate 112 may be reduced.

The embodiments described with reference to FIG. 16 may be substantially the same as or similar to the embodiments described with reference to FIG. 15 except for the arrangement of the first support 111, and thus in the following, some redundant descriptions may be omitted.

Figure 17:
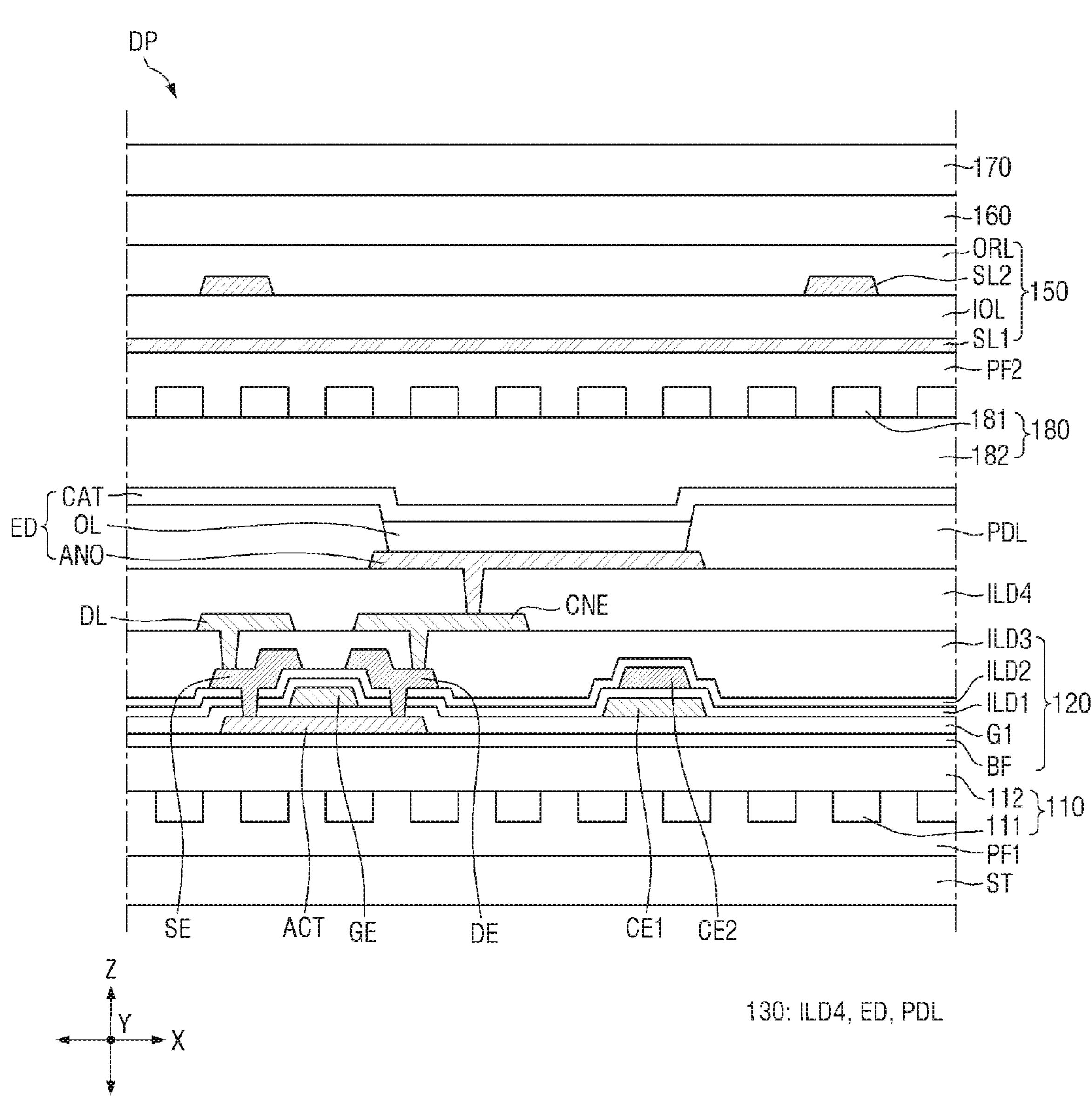
FIG. 17 is a cross-sectional view of a display panel of a display device according to some embodiments.

FIG. 17 is a cross-sectional view of a display panel of a display device according to some embodiments.

The embodiments described with reference to FIG. 17 is mainly different from the embodiments described with reference to FIG. 3 in that the thin-film encapsulation layer 140 is omitted and a display panel DP further includes a second substrate 180.

Referring to FIG. 17, the display panel DP may include a first substrate 110, a circuit driving layer 120 arranged on the first substrate 110, a light-emitting element layer 130 arranged on the circuit driving layer 120, a second substrate 180 arranged on the light-emitting element layer 130, a touch sensing layer 150 arranged on the second substrate 180, a polarizing layer 160 arranged on the touch sensing layer 150, and a protective layer 170 arranged on the polarizing layer 160.

The second substrate 180 may be arranged on the light-emitting element layer 130. In this case, the thin-film encapsulation layer 140 may be omitted.

The second substrate 180 may be interposed between the light-emitting element layer 130 and the touch sensing layer 150. When the touch sensing layer 150 is omitted, the second substrate 180 may be interposed between the light-emitting element layer 130 and the polarizing layer 160.

The second substrate 180 may include a second flexible substrate 182 and a second support 181 arranged on the second flexible substrate 182. In FIG. 17, unlike the first substrate 110, the second support 181 of the second substrate 180 is arranged on an upper surface of the second flexible substrate 182 of the second substrate 180, but embodiments according to the present disclosure are not limited thereto. The second support 181 may be arranged on a lower surface of the second flexible substrate 182.

The second flexible substrate 182 and the second support 181 may be substantially the same or similar to the first flexible substrate 112 and the first support 111, respectively. That is, the features of the first flexible substrate 112 and the first support 111 described above with reference to FIGS. 1 to 13 may be equally applied to the second flexible substrate 182 and the second support 181 within a range that can be changed by those skilled in the art. For example, a plurality of areas similar to the first areas A1 and the second areas A2 of the first support 111 shown in FIGS. 4 to 16 may be defined in the second support 181 depending on a thickness at which the second support 181 is arranged on the upper surface of the second flexible substrate 182. In this case, the second support 181 may be arranged as a plurality of supports and may be arranged as one layer, and a plurality of slits or grooves that are substantially the same as or similar to the plurality of slits H or the plurality of grooves G formed in the first supports 111 shown in FIGS. 4 to 16 may be formed in the second support 181.

The display panel DP may further include a first protective member PF1 arranged on a lower surface of the first substrate 110 and a support member ST arranged on a lower surface of the first protective member PF1. The display panel DP may further include a second protective member PF2 arranged on an upper surface of the second substrate 180. The second protective member PF2 may be interposed between the second substrate 180 and the touch sensing layer 150 or between the second substrate 180 and the polarizing layer 160. The second protective member PF2 may be made of a material that is substantially the same as or similar to that of the first protective member PF1.

The embodiments described with reference to FIG. 17 may be substantially the same as or similar to the example embodiments described with reference to FIG. 3 except that the thin-film encapsulation layer 140 may be omitted and the display panel DP further includes the second substrate 180, and thus in the following, some redundant descriptions may be omitted.

Figure 18:
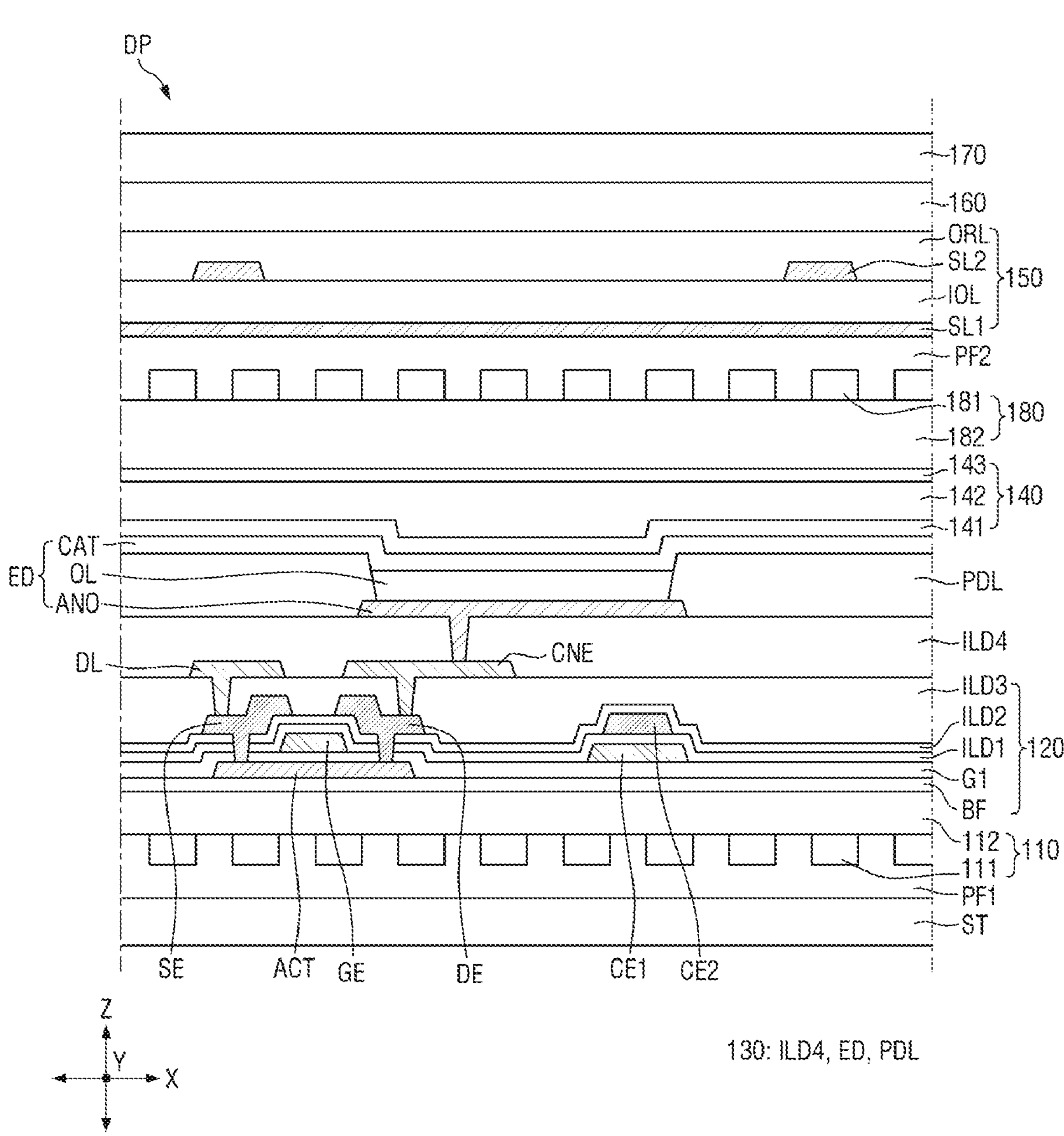
FIG. 18 is a cross-sectional view of a display panel of a display device according to some embodiments.

FIG. 18 is a cross-sectional view of a display panel of a display device according to some embodiments.

The embodiments described with reference to FIG. 18 are different from the embodiments described with reference to FIG. 17 in that a display panel DP further includes a second substrate 180, and a thin-film encapsulation layer 140 is not omitted.

Referring to FIG. 18, the display panel DP may include a first substrate 110, a circuit driving layer 120 arranged on the first substrate 110, a light-emitting element layer 130 arranged on the circuit driving layer 120, the thin-film encapsulation layer 140 arranged on the light-emitting element layer 130, the second substrate 180 arranged on the thin-film encapsulation layer 140, a touch sensing layer 150 arranged on the second substrate 180, a polarizing layer 160 arranged on the touch sensing layer 150, and a protective layer 170 arranged on the polarizing layer 160.

The thin-film encapsulation layer 140 may be arranged on one surface of the light-emitting element layer 130. The thin-film encapsulation layer 140 may be interposed between the light-emitting element layer 130 and the second substrate 180. The thin-film encapsulation layer 140 may include a first inorganic encapsulation film 141 arranged on a second electrode CAT, an organic encapsulation film 142 arranged on the first inorganic encapsulation film 141, and a second inorganic encapsulation film 143 arranged on the organic encapsulation film 142. An upper surface of the second inorganic encapsulation film 143 may be spaced apart from or in direct contact with a lower surface of the second substrate 180.

According to some embodiments, a wavelength conversion pattern, which is configured to convert or shift a peak wavelength of light incident from a light-emitting layer of the light-emitting element layer 130 into another particular peak wavelength to emit light, may be arranged on the thin-film encapsulation layer 140.

The embodiments described with reference to FIG. 18 may be substantially the same as or similar to the embodiments described with reference to FIG. 17 except that the display panel DP further includes the second substrate 180, and the thin-film encapsulation layer 140 is not omitted, and thus in the following, some redundant descriptions may be omitted.

Figure 19:
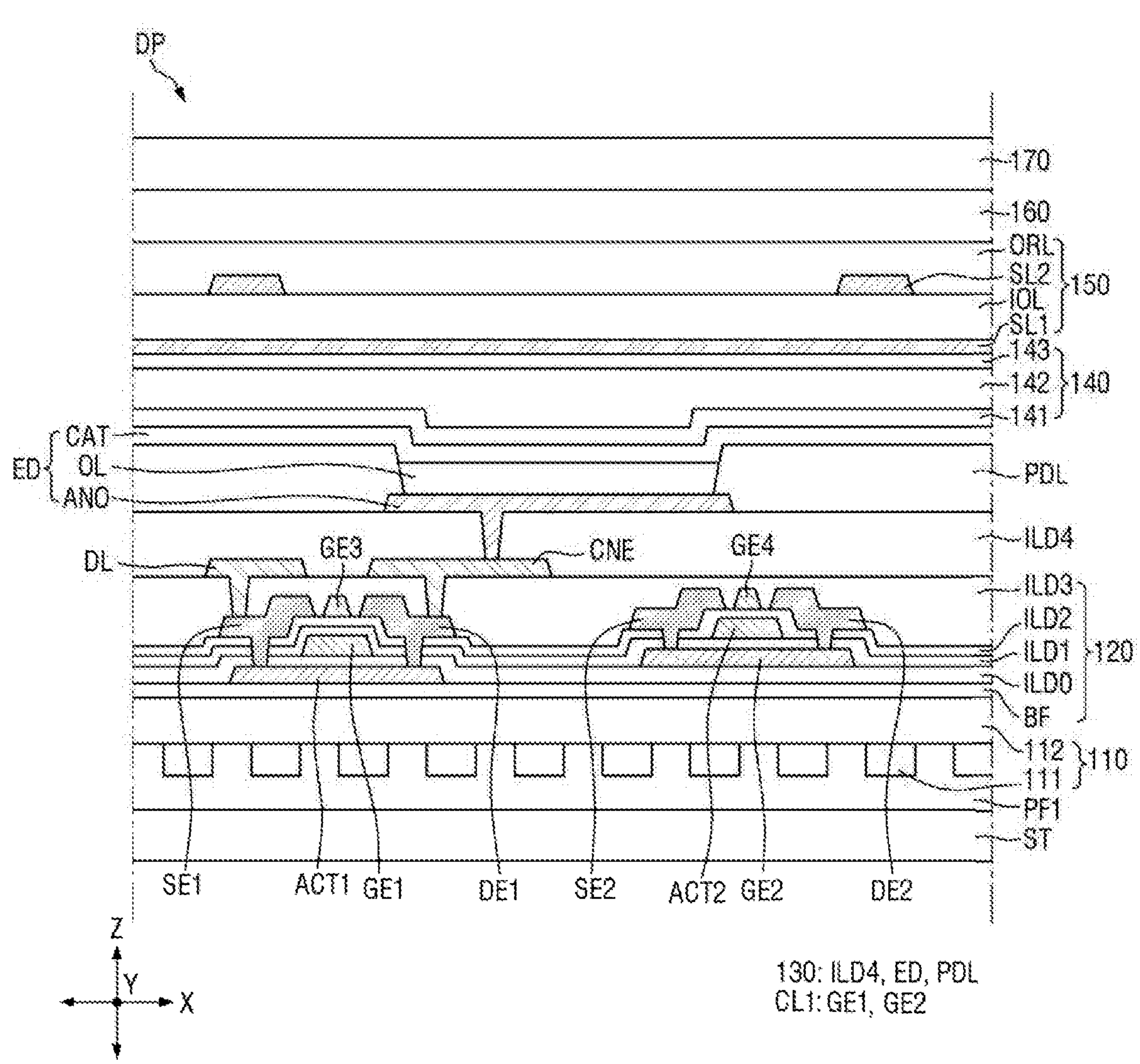
FIG. 19 is a cross-sectional view of a display panel of a display device according to some embodiments.

FIG. 19 is a cross-sectional view of a display panel of a display device according to some embodiments.

The embodiments described with reference FIG. 19 is different from the embodiments described with reference FIG. 3 in that a circuit driving layer 120 includes a transistor including a semiconductor layer made of oxide and a transistor including a semiconductor layer made of crystallized silicon.

Referring to FIG. 19, a display panel DP may include a first substrate 110, the circuit driving layer 120, a light-emitting element layer 130, a thin-film encapsulation layer 140, a touch sensing layer 150, a polarizing layer 160, and a protective layer 170.

The circuit driving layer 120 may include a buffer layer BF, a barrier layer BR, a first semiconductor layer ACT1, a first insulating layer ILD0, a first conductive layer CL1, a second insulating layer ILD1, a second semiconductor layer ACT2, a third insulating layer ILD2, a second conductive layer CL2, a fourth insulating layer ILD3, a third conductive layer CL3, and a fifth insulating layer ILD4.

The transistor including a semiconductor layer made of oxide may be arranged in one area of the first substrate 110, for example, on a right area of FIG. 19, and the transistor including a semiconductor layer made of crystallized silicon may be arranged in the other area around the one area, for example, a left area of FIG. 19. The transistor including the semiconductor layer made of oxide may be implemented by a second-first gate electrode GE1, a second-second gate electrode GE2, the first semiconductor layer ACT1, a first source electrode SE1, and a first drain electrode DE1, which will be described below, and the transistor including the semiconductor layer made of crystallized silicon may be implemented by a bottom gate electrode GE2, a top gate electrode GE4, a second semiconductor layer ACT2, a second source electrode SE2, and a second drain electrode DE2, which will be described below.

The buffer layer BF may be arranged on the first substrate 110.

The first semiconductor layer ACT1 may be arranged on the barrier layer BR. The first semiconductor layer ACT1 may be arranged in the other area of the first substrate 110.

According to some embodiments, a barrier layer may be interposed between the first semiconductor layer ACT1 and the buffer layer BF. The barrier layer may be made of at least one selected from silicon nitride, silicon oxide, and silicon oxynitride.

The first semiconductor layer ACT1 may be made of amorphous silicon, polysilicon, or the like. In this case, the polysilicon may be formed by crystallizing the amorphous silicon. A method of crystallizing the amorphous silicon may include various methods including a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or the like.

The first insulating layer ILD0 may be arranged on the first semiconductor layer ACT1. The first insulating layer ILD0 may be a gate insulating film having a gate insulating function. The first insulating layer ILD0 may include a silicon compound, a metal oxide, or the like. For example, the first insulating layer ILD0 may include silicon oxide, silicon nitride, silicon oxynitride, aluminum oxide, tantalum oxide, hafnium oxide, zirconium oxide, titanium oxide, or the like. These may be used alone or as a combination thereof. The first insulating layer ILD0 may be a single film or a multilayer film made of stacked films of different materials.

The first conductive layer CL1 is arranged on the first insulating layer ILD0. The first conductive layer CL1 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The first conductive layer CL1 may include the bottom gate electrode GE2 arranged in the one area, and the second-first gate electrode GE1 arranged in the other area. The bottom gate electrode GE2 and the second-first gate electrode GE1 may be formed concurrently and may be made of the same material. The second-first gate electrode GE1 and a second-second gate electrode GE3 may form a mutual capacitor.

The bottom gate electrode GE2 may be a lower light-shielding pattern. That is, the bottom gate electrode GE2 may serve to prevent light incident from the lower portion of the display panel DP from entering the second semiconductor layer ACT2 located thereon.

The second insulating layer ILD1 is arranged on the first conductive layer CL1. The second insulating layer ILD1 may be a gate insulating film having a gate insulating function. The second insulating layer ILD1 may include a silicon compound, a metal oxide, or the like. For example, the second insulating layer ILD1 may include silicon oxide, silicon nitride, silicon oxynitride, aluminum oxide, tantalum oxide, hafnium oxide, zirconium oxide, titanium oxide, or the like. These may be used alone or as a combination thereof.

The second semiconductor layer ACT2 is arranged on the second insulating layer ILD1. The second semiconductor layer ACT2 may be arranged in the one area of the first substrate 110. The second semiconductor layer ACT2 may be made of an oxide. That is, the second semiconductor layer ACT2 may be an oxide semiconductor layer ACT. The oxide may include at least one oxide selected from gallium indium zinc oxide (G-I-Z-O), zinc (Zn) oxide, indium (In) oxide, gallium (Ga) oxide, tin (Sn) oxide, cadmium (Cd) oxide, germanium (Ge) oxide, hafnium (Hf) oxide, and a combination thereof. The oxide may include at least one selected among indium gallium zinc oxide (IGZO), zinc tin oxide (ZTO), and indium tin oxide (ITO).

The third insulating layer ILD2 is arranged on the second semiconductor layer ACT2. The third insulating layer ILD2 may be a gate insulating film having a gate insulating function. The third insulating layer ILD2 may include a silicon compound, a metal oxide, or the like. For example, the third insulating layer ILD2 may include silicon oxide, silicon nitride, silicon oxynitride, aluminum oxide, tantalum oxide, hafnium oxide, zirconium oxide, titanium oxide, or the like. These may be used alone or as a combination thereof.

The second conductive layer CL2 is arranged on the third insulating layer ILD2. The second conductive layer CL2 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second conductive layer CL2 may include the top gate electrode GE4 arranged in the one area, and the second-second gate electrode GE3 arranged in the other area. The top gate electrode GE4 and the second-second gate electrode GE3 may be formed concurrently and may be made of the same material.

The fourth insulating layer ILD3 is arranged on the second conductive layer CL2. The fourth insulating layer ILD3 may be an interlayer insulating film having an interlayer insulating function. The fourth insulating layer ILD3 may include a silicon compound, a metal oxide, or the like. For example, the fourth insulating layer ILD3 may include silicon oxide, silicon nitride, silicon oxynitride, aluminum oxide, tantalum oxide, hafnium oxide, zirconium oxide, titanium oxide, or the like. These may be used alone or as a combination thereof.

A thickness of the fourth insulating layer ILD3 may be greater than a thickness of the first insulating layer ILD0 described above. The first to third insulating layers ILD0 to ILD2 are formed to have the same thickness on entire surfaces thereof and conformally reflect a lower stepped portion. Unlike the first to third insulating layers ILD0 to ILD2, the fourth insulating layer ILD3 may not conformally reflect a stepped portion of a lower structure. Accordingly, the fourth insulating layer ILD3 may serve to allow the third conductive layer CL3 arranged thereon to be arranged to be flat.

The third conductive layer CL3 is arranged on the fourth insulating layer ILD3. The third conductive layer CL3 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third conductive layer CL3 may include the first source and drain electrodes SE1 and DE1 arranged in the other area, and the second source and drain electrodes SE2 and DE2 arranged in the other area.

The first source and drain electrodes SE1 and DE1 may be respectively connected to source and drain areas of the first semiconductor layer ACT1, and the second source and drain electrodes SE2 and DE2 may be respectively connected to source and drain areas of the second semiconductor layer ACT2.

The fifth insulating layer ILD4 is arranged on the third conductive layer CL3. The fifth insulating layer ILD4 may include an inorganic insulating material or an organic insulating material such as an acrylic-based resin (polyacrylate resin), an epoxy resin, a phenolic resin, a polyamide-based resin, a polyimide-based resin, an unsaturated polyester-based resin, a polyphenylene-based resin, a polyphenylene-sulfide-based resin, or benzocyclobutene (BCB).

The light-emitting element layer 130, specifically, the first electrode ANO of the light-emitting element layer 130 may be arranged on the fifth insulating layer ILD4.

The embodiments described with reference FIG. 19 may be substantially the same as or similar to the embodiments described with reference FIG. 3 except that the circuit driving layer 120 includes the transistor including the semiconductor layer made of oxide and the transistor including the semiconductor layer made of crystallized silicon, and thus in the following, redundant descriptions will be omitted.

Figure 20:
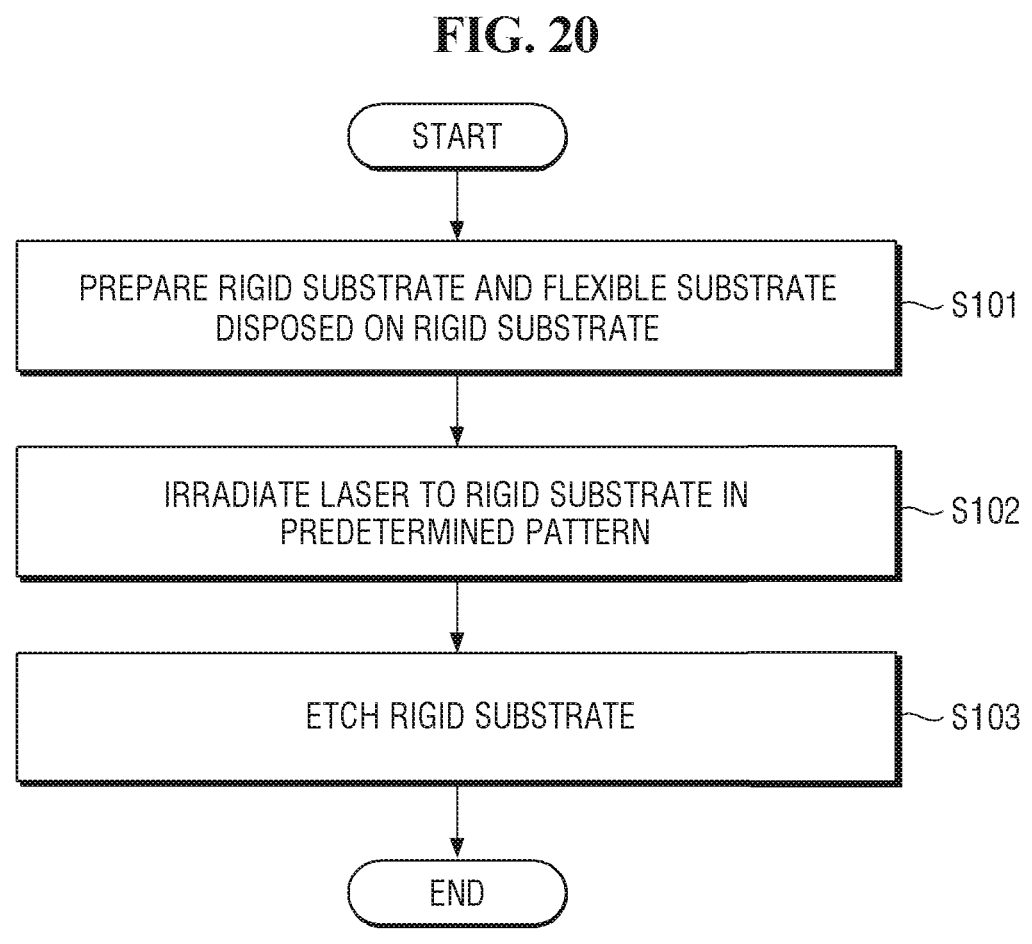

FIG. 20 is a flowchart illustrating a method of manufacturing a display device according to some embodiments. FIGS. 21 to 24 are diagrams illustrating operations of the method of manufacturing a display device according to some embodiments.

A display device 1 manufactured by the following display device manufacturing method may be the display device 1 described in FIG. 1, but embodiments according to the present disclosure are not limited thereto.

Referring to FIG. 20, the method of manufacturing a display device may include preparing a rigid substrate 111' and a flexible substrate 112' arranged on the rigid substrate 111' (S101), irradiating a laser to the rigid substrate 111' in a pattern (e.g., a set or predetermined pattern) (S102), and etching the rigid substrate 111' (S103).

The method of manufacturing a display device of FIG. 20 is an example, and in the method of manufacturing a display device, at least one of the above operations may be omitted, or at least one other operation may be further included with reference to other descriptions of the present specification. Additionally, according to some embodiments, the order of operations may vary without departing from the spirit and scope of embodiments according to the present disclosure.

Hereinafter, the method of manufacturing a display device will be described in more detail with further reference to FIGS. 21 to 24.

Figure 21:
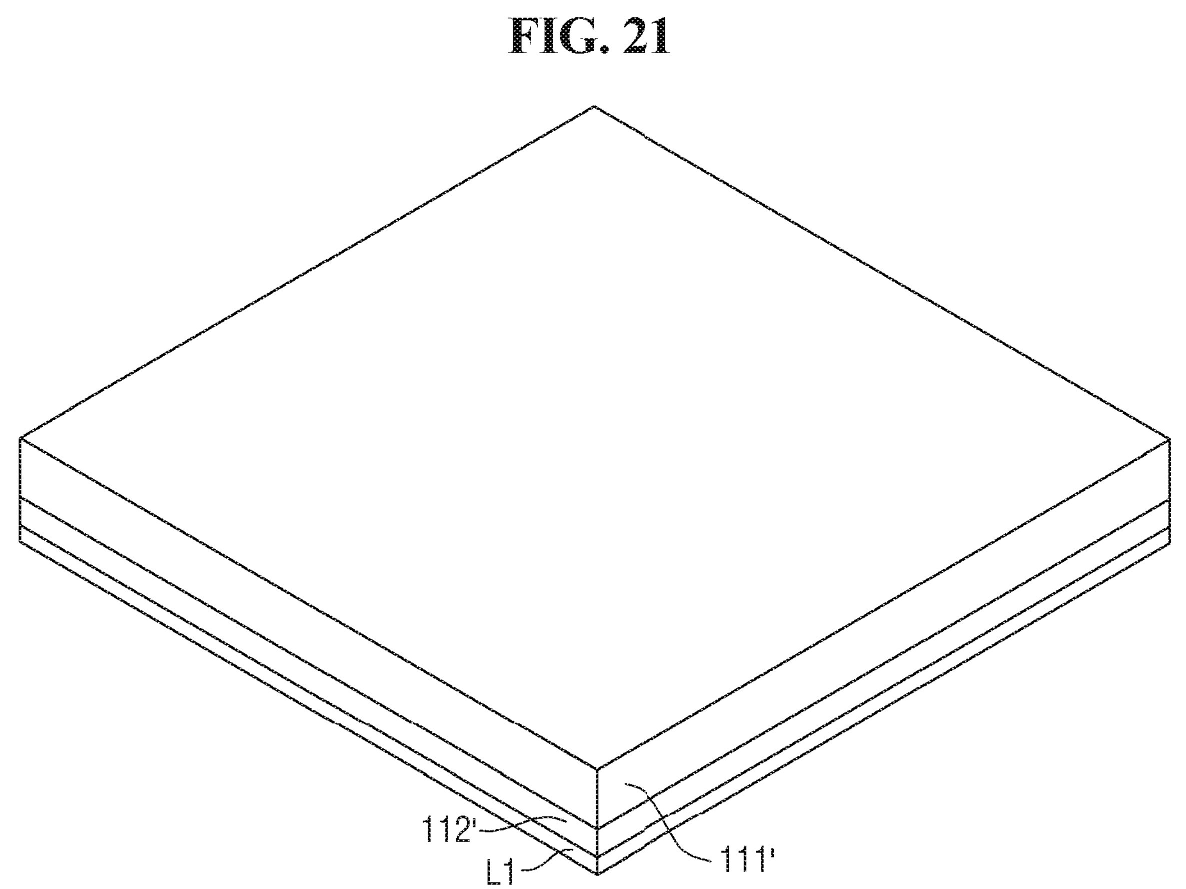
FIGS. 21 to 24 are diagrams illustrating operations of the method of manufacturing a display device according to some embodiments.

Referring to FIG. 21, the rigid substrate 111' may be prepared. The flexible substrate 112' may be arranged on one surface of the rigid substrate 111'.

The rigid substrate 111' may include a rigid material such as glass or quartz. The rigid substrate 111' may be a carrier substrate for forming a first layer L1, which will be described below.

The flexible substrate 112' may be in a state of being attached to one surface of the rigid substrate 111' by a lamination method. The flexible substrate 112' may be the first flexible substrate 112 or the second flexible substrate 182 illustrated in FIG. 2, 14, 15, or 16. The flexible substrate 112' may be made of an insulating material such as a flexible polymer resin. For example, the flexible substrate 112' may include polyimide, but embodiments according to the present disclosure are not limited thereto.

The first layer L1 may be attached to the other surface of the rigid substrate 111', which is opposite to one surface of the rigid substrate 111'. The method of manufacturing a display device may further include stacking the first layer L1 on the other surface of the rigid substrate 111'.

With further reference to FIGS. 2, 14, 15, and 16, the first layer L1 may include at least one layer stacked on the flexible substrate 112'. For example, the first layer L1 may include at least one of a circuit driving layer 120, a light-emitting element layer 130, a thin-film encapsulation layer 140, a second substrate 180, a touch sensing layer 150, a polarizing layer 160, or a protective layer 170. That is, the flexible substrate 112' and the first layer L1 of FIG. 21 may be the flexible substrate 112' and at least one layer stacked on one surface of the flexible substrate 112' in FIG. 2, 14, 15, or 16 in a vertically inverted state, respectively.

Figure 22:
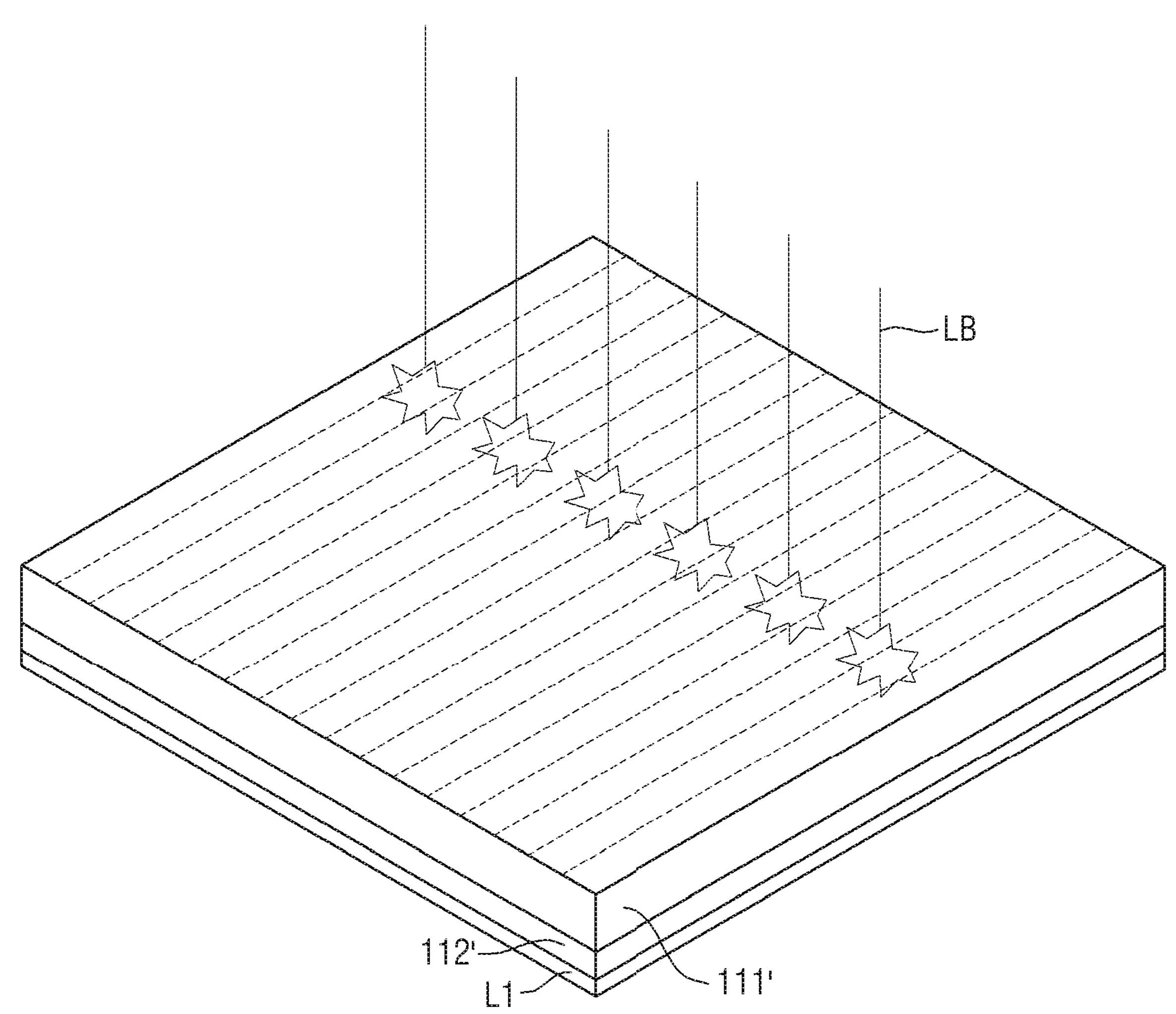

Referring to FIG. 22, after the rigid substrate 111' and the flexible substrate 112' are prepared, a laser may be irradiated to one surface of the rigid substrate 111'.

The laser may be irradiated to one surface of the rigid substrate 111' in a pattern (e.g., a set or predetermined pattern). For example, the laser may be irradiated to one surface of the rigid substrate 111' in a stripe pattern as shown in FIG. 22.

The laser may be a femtosecond laser. The "femtosecond laser" may refer to a laser having a pulse width in a range of 200 femtoseconds to 500 femtoseconds.

The laser may be light in a short wavelength range from a near-infrared (IR) laser to an ultraviolet (UV) laser or light in a multi-wavelength range including light in various wavelength ranges.

Structural deformation of a material constituting the rigid substrate 111' may occur in the area of the rigid substrate 111', to which the laser is irradiated. For example, when the rigid substrate 111' is made of glass, Si—O bonds in the area of the rigid substrate 111', to which the laser is irradiated, may be broken. Accordingly, etching selectivity in the corresponding area may increase in comparison with an area to which the laser is not irradiated.

Figure 23:
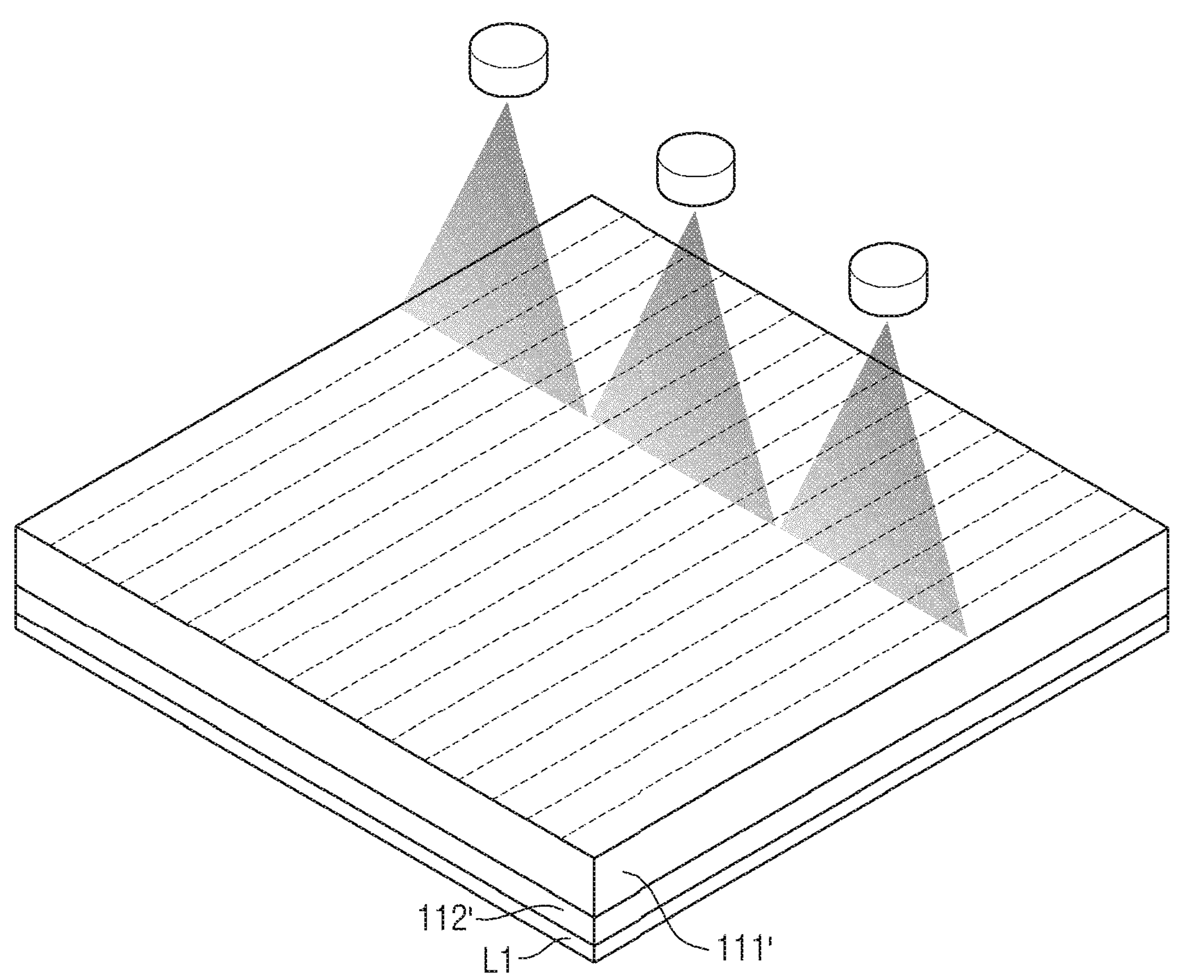

Referring to FIG. 23, after the irradiating of the laser is completed, the rigid substrate 111' may be etched.

The rigid substrate 111' may be wet etched. In the wet etching, a basic solution such as potassium hydroxide or sodium hydroxide or an acidic solution such as hydrofluoric acid may be used.

Figure 24:
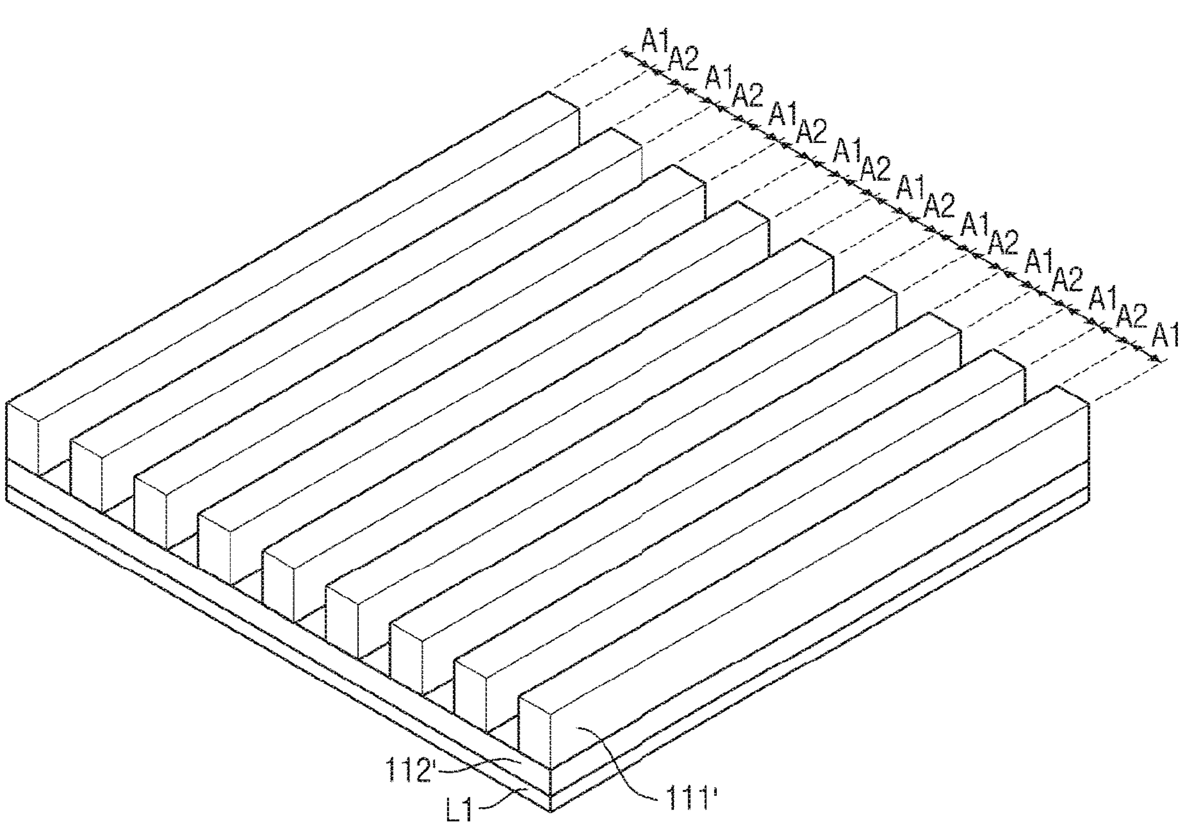

Because the etching selectivity of the area to which the laser is irradiated is greater than that of the remaining area, the area of the rigid substrate 111' to which the laser is irradiated is gradually etched from an upper portion thereof so that a thickness thereof may be reduced. Accordingly, as shown in FIG. 24, a plurality of first areas A1, in which the etching is hardly performed, and a plurality of second areas A2, from which some or all of the rigid substrate 111' are removed, may be alternately formed on the rigid substrate 111'.

Because some or all of the rigid substrate 111' arranged in the second area A2 are removed, the second area A2 may have a rigidity less than that of the first area A1. That is, the first support 111, 111*a*, 111*b*, or 111*c* and/or the second support 181 shown in FIGS. 4 to 19 may be formed by processing the rigid substrate 111' described above.

With further reference to FIG. 3, according to some embodiments, the method of manufacturing a display device may further include stacking a first protective member PF1 and/or a second protective member PF2 on the rigid substrate 111' after the etching is completed. In addition, with further reference to FIGS. 18 and 19, the method of manufacturing the display device 1 may further include stacking at least one of the second substrate 180 or the plurality of layers on the second substrate 180 on the thin-film encapsulation layer 140 before and after the rigid substrate 111' is processed.

A display device and a method of manufacturing a display device according to some embodiments can provide relatively excellent surface quality while securing flexibility and mechanical strength enabling bending, folding, rolling, or the like.

The characteristics of embodiments according to the present disclosure are not limited by the content described above, and more various characteristics are included in the present specification.

In concluding the detailed description, those skilled in the art will appreciate that many variations and modifications can be made to the example embodiments without departing from the principles of the present invention. Therefore, the disclosed embodiments of the invention are used in a generic and descriptive sense only and not for purposes of limitation.

What is claimed is:

1. A display device comprising:

a light-emitting element layer;

a flexible substrate overlapping the light-emitting element layer;

a plurality of supports on a bottom surface of the flexible substrate and spaced apart from each other in a first direction and extending in a second direction crossing the first direction, wherein each of the plurality of supports includes glass and has a thickness of 0.1 mm or more; and a flexible protective material formed as a continuous material that is between the plurality of supports along the first direction and extends past a bottom surface of the plurality of supports facing away from the light-emitting element layer in a third direction crossing the first direction and the second direction and across the bottom surface of the plurality of supports in the first direction, wherein the bottom surface of the plurality of supports are disposed between the flexible protective material and the flexible substrate.

2. The display device of claim 1, comprising a plurality of slits each between the plurality of supports and extending in the second direction.

3. The display device of claim 2, wherein the plurality of supports and the plurality of slits have a stripe pattern in a plan view.

4. The display device of claim 1, wherein each of the plurality of supports includes a first surface facing the flexible substrate, a second surface opposite to the first surface, a side surface connecting the first surface and the second surface, and a curved surface between the second surface and the side surface.

5. The display device of claim 4, wherein the side surface of a support from among the plurality of supports is inclined in a direction crossing a thickness direction.

6. The display device of claim 5, wherein the side surface of the support is inclined such that a width of the support in the first direction decreases from the first surface of the support toward the second surface of the support.

7. The display device of claim 1, further comprising:

a thin-film transistor layer including a plurality of transistors; and the light-emitting element layer on the thin-film transistor layer, wherein the thin-film transistor layer and the light-emitting element layer are on a first surface of the flexible substrate, and the plurality of supports are on a second surface of the flexible substrate opposite the first surface of the flexible substrate.

8. A display device comprising:

a light-emitting element layer;

a flexible substrate overlapping the light-emitting element layer;

a support on a bottom surface of the flexible substrate and made of a rigid material, wherein the support includes a plurality of grooves spaced apart from each other in a first direction and extending in a second direction crossing the first direction; and a flexible protective material in the plurality of grooves along the first direction, wherein the support includes a portion between two adjacent grooves among the plurality of grooves, wherein the flexible protective material is formed as a continuous material that is in the grooves and extends past a bottom surface of the support facing away from the light-emitting element layer in a third direction crossing the first direction and the second direction and across the bottom surface of the portion of the support in the first direction, and wherein the bottom surface of the portion of the support is disposed between the flexible protective material and the flexible substrate.

9. The display device of claim 8, comprising the plurality of grooves extending in the second direction and each recessed in a thickness direction from one surface of the support.

10. The display device of claim 9, wherein the plurality of grooves have a stripe pattern in a plan view.

11. The display device of claim 8, wherein the support includes a first surface facing the flexible substrate and a second surface opposite to the first surface, and each of the grooves includes both side surfaces extending in a thickness direction and between the first surface of the support and the second surface of the support, a bottom surface connecting the both side surfaces, and a curved surface between the side surface and the second surface of the support.

12. The display device of claim 11, wherein a side surface of a groove is inclined in a direction crossing the thickness direction.

13. The display device of claim 12, wherein the side surface of the groove is inclined such that a width of the groove increases from the first surface of the support toward the second surface of the support.

14. The display device of claim 8, further comprising:

a thin-film transistor layer including a plurality of transistors; and the light-emitting element layer on the thin-film transistor layer, wherein the thin-film transistor layer and the light-emitting element layer are on a first surface of the flexible substrate, and the support is on a second surface of the flexible substrate, which is opposite to the first surface of the flexible substrate.

15. A display device comprising:

a first substrate;

a thin-film transistor layer on the first substrate;

a light-emitting element layer on the thin-film transistor layer; and a second substrate on the light-emitting element layer, wherein at least one of the first substrate or the second substrate includes a flexible substrate and a plurality of support members that are on a bottom surface of the flexible substrate and made of glass and spaced apart from each other in a first direction and extending in a second direction crossing the first direction; and a flexible protective material formed as a continuous material that is between the plurality of supports along the first direction and extends past a bottom surface of the plurality of supports facing away from the light-emitting element layer in a third direction crossing the first direction and the second direction and across the bottom surface of the plurality of support members in the first direction, wherein the bottom surface of the plurality of support members are disposed between the flexible protective material and the flexible substrate.

16. The display device of claim 15, wherein a plurality of support members are on the flexible substrate forming a stripe pattern.

17. The display device of claim 15, wherein the support members are formed as one layer on a first surface of the flexible substrate and include a plurality of grooves recessed in a thickness direction from a first surface of the support members.

18. A method of manufacturing a display device, the method comprising:

preparing a rigid substrate and a flexible substrate on the rigid substrate;

irradiating a laser to the rigid substrate in a predetermined pattern;

etching the rigid substrate, wherein the etching of the rigid substrate includes at least one of forming a plurality of slits in the rigid substrate or forming a plurality of grooves in the rigid substrate; and forming a flexible protective material as a continuous material that is in the plurality of slits or the plurality of grooves and extends past a bottom surface, facing away from the flexible substrate, of the plurality of slits or the plurality of grooves and across the bottom surface of the rigid substrate opposite the flexible substrate, wherein the bottom surface of the of the rigid substrate is disposed between the flexible protective material and the flexible substrate.

19. The method of claim 18, wherein the irradiating of the laser to the rigid substrate in the predetermined pattern includes irradiating the laser to the rigid substrate in a stripe pattern.

20. The method of claim 18, wherein the etching of the rigid substrate is performed by a wet etching process.

* * * * *